(12) United States Patent
Lin et al.

(10) Patent No.: US 12,469,814 B2
(45) Date of Patent: Nov. 11, 2025

(54) INTEGRATED CIRCUIT PACKAGE AND METHOD OF FORMING SAME

(71) Applicant: Taiwan Semiconductor Manufacturing Co., Ltd., Hsinchu (TW)

(72) Inventors: Yu-Sheng Lin, Zhubei (TW); Shu-Shen Yeh, Taoyuan (TW); Ming-Chih Yew, Hsinchu (TW); Chin-Hua Wang, New Taipei (TW); Shin-Puu Jeng, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 605 days.

(21) Appl. No.: 17/664,689

(22) Filed: May 24, 2022

(65) Prior Publication Data

US 2023/0387063 A1    Nov. 30, 2023

(51) Int. Cl.
*H01L 23/00* (2006.01)
*H01L 23/498* (2006.01)
*H01L 25/065* (2023.01)

(52) U.S. Cl.
CPC ........ *H01L 24/32* (2013.01); *H01L 23/49833* (2013.01); *H01L 24/27* (2013.01); *H01L 25/0655* (2013.01); *H01L 23/49816* (2013.01); *H01L 23/49822* (2013.01); *H01L 23/49838* (2013.01); *H01L 24/16* (2013.01); *H01L 24/73* (2013.01); *H01L 2224/16227* (2013.01); *H01L 2224/16237* (2013.01); *H01L 2224/26155* (2013.01); *H01L 2224/27013* (2013.01); *H01L 2224/3201* (2013.01); *H01L 2224/32225* (2013.01); *H01L 2224/73204* (2013.01);
(Continued)

(58) Field of Classification Search
CPC . H01L 23/562; H01L 23/49541–49548; H01L 23/31–3157; H01L 2224/1012–10175; H01L 2224/26152–26165; H01L 2224/73204; H01L 2924/3511–3512; H01L 21/56–563; H01L 25/03–0756; H01L 23/49833; H01L 23/5385; H01L 2924/35–35121
See application file for complete search history.

(56) References Cited

U.S. PATENT DOCUMENTS 8,993,380 B2   3/2015   Hou et al.
9,281,254 B2   3/2016   Yu et al.
(Continued)

*Primary Examiner* — Julio J Maldonado
*Assistant Examiner* — Eric Manuel Mulero Flores
(74) *Attorney, Agent, or Firm* — Slater Matsil, LLP

(57) ABSTRACT

A package includes a package substrate, the package substrate having a first side and a second side opposite to the first side, a package component bonded to the first side of the package substrate, a front-side warpage control structure attached to the first side of the package substrate, and a backside warpage control structure embedded in the package substrate from the second side of the package substrate. The front-side warpage control structure includes a first disconnected structure and a second disconnected structure laterally separated from each other by a gap. The backside warpage control structure includes a third disconnected structure and a fourth disconnected structure laterally separated from each other.

20 Claims, 35 Drawing Sheets

(52) U.S. Cl.
CPC ............... *H01L 2924/1431* (2013.01); *H01L 2924/1436* (2013.01); *H01L 2924/3511* (2013.01); *H01L 2924/35121* (2013.01); *H01L 2924/37001* (2013.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Khalid et al. |
| 2016/0379937 A1* | 12/2016 | Cho ................ H05K 1/111 174/261 |
| 2020/0105684 A1* | 4/2020 | Chang ............ H01L 23/3135 |
| 2020/0365525 A1* | 11/2020 | Wu ................. H01L 21/486 |
| 2021/0202332 A1* | 7/2021 | Hu .................. H01L 21/6835 |
| 2022/0013475 A1* | 1/2022 | Kim ................ H01L 25/0652 |
| 2022/0208667 A1* | 6/2022 | Lin ................. H01L 24/32 |
| 2023/0124098 A1* | 4/2023 | Kuan ............... H01L 23/16 257/659 |

* cited by examiner

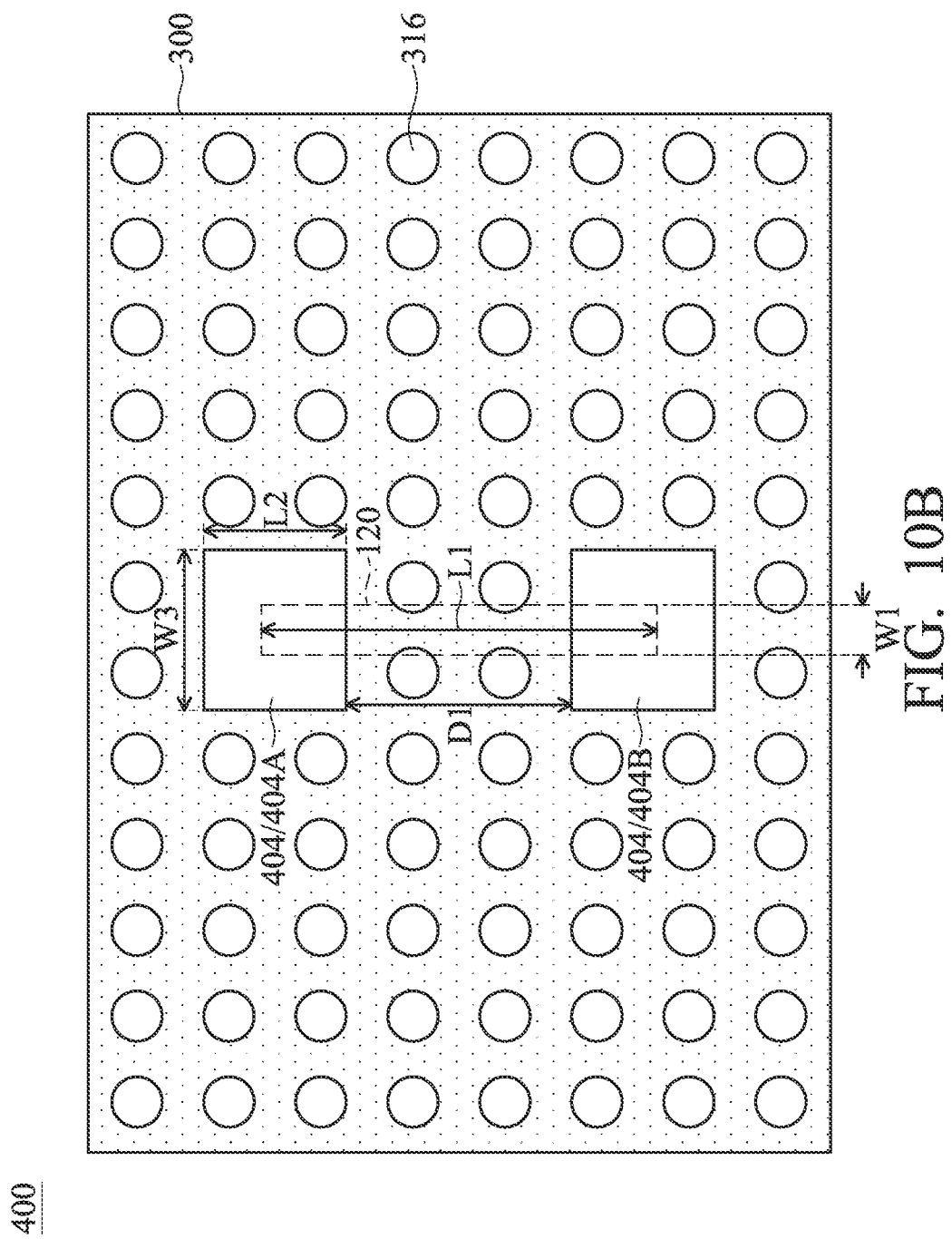

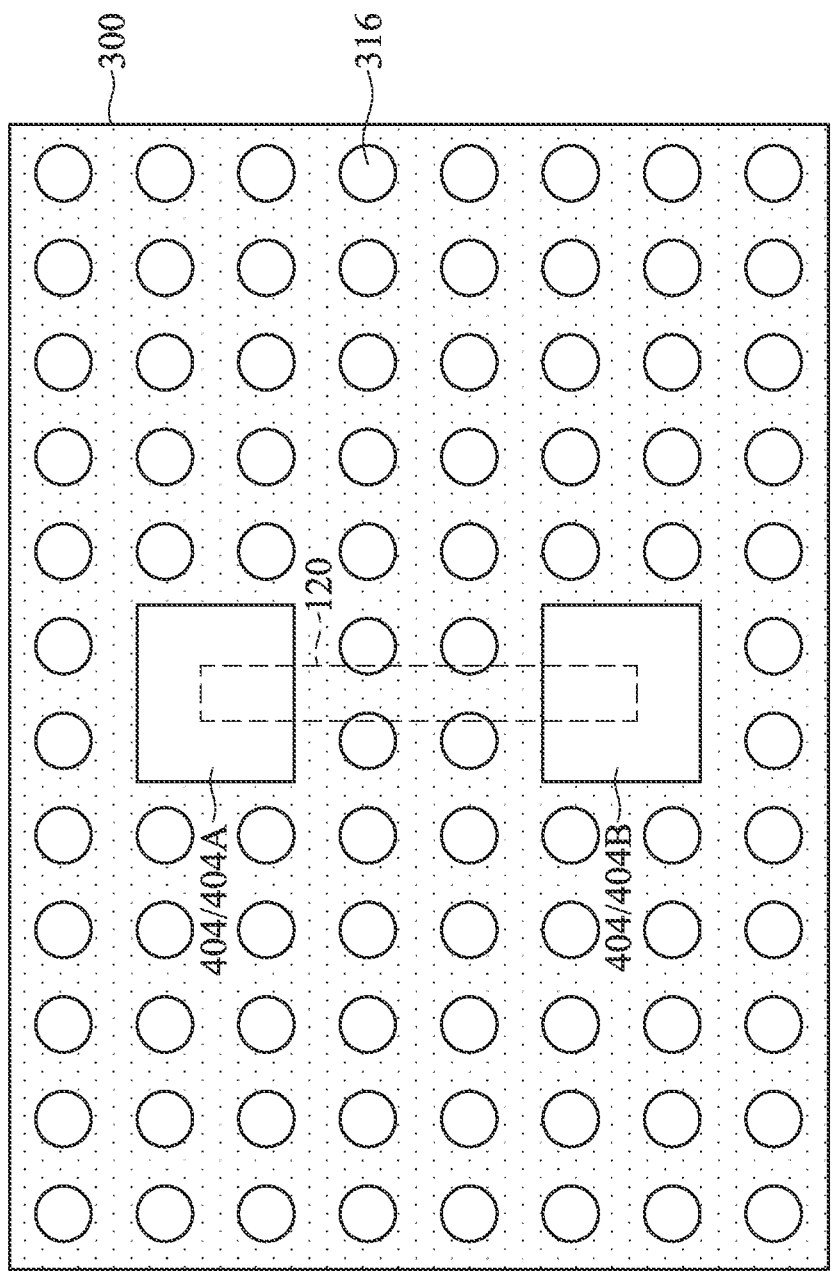

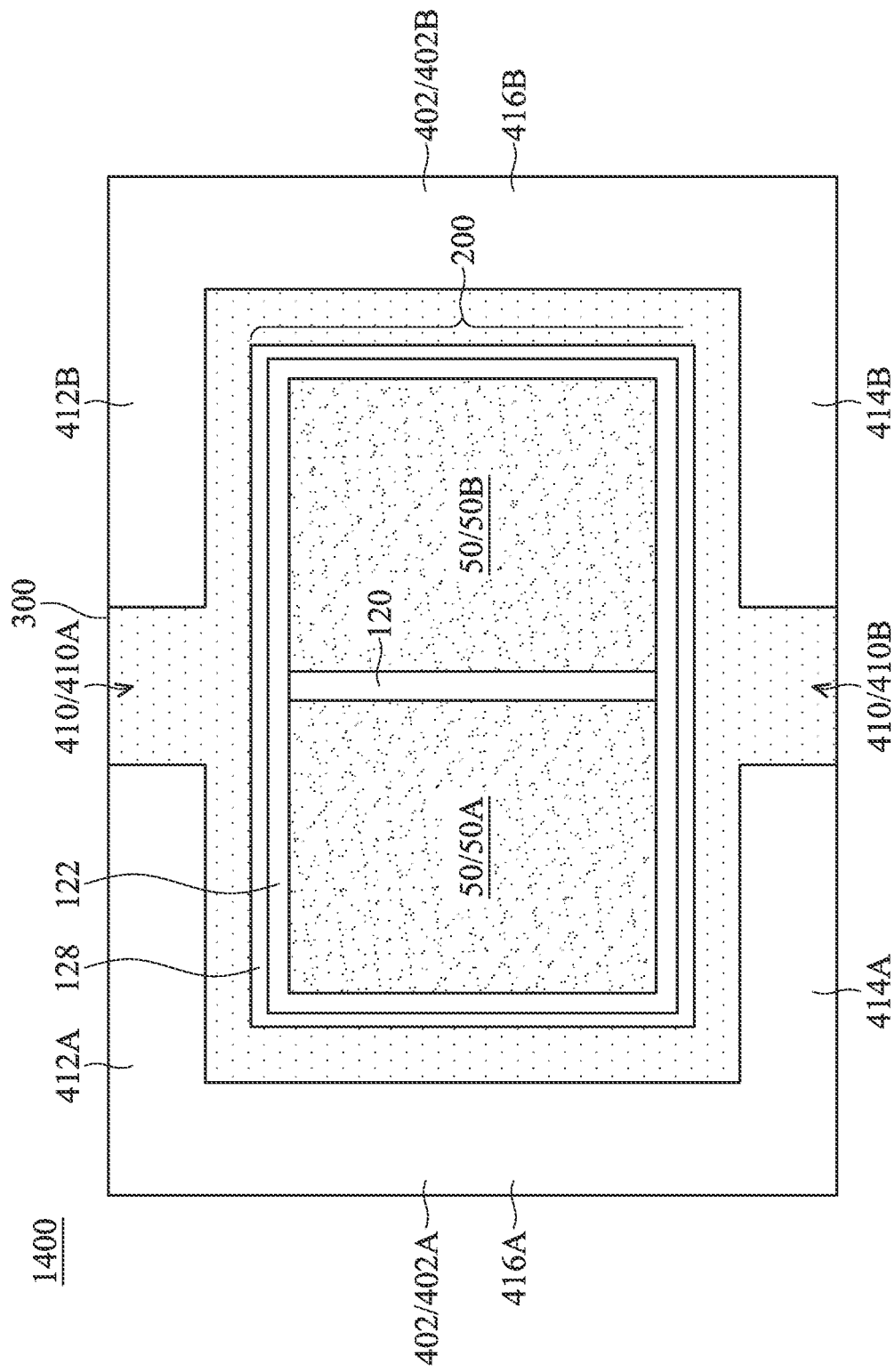

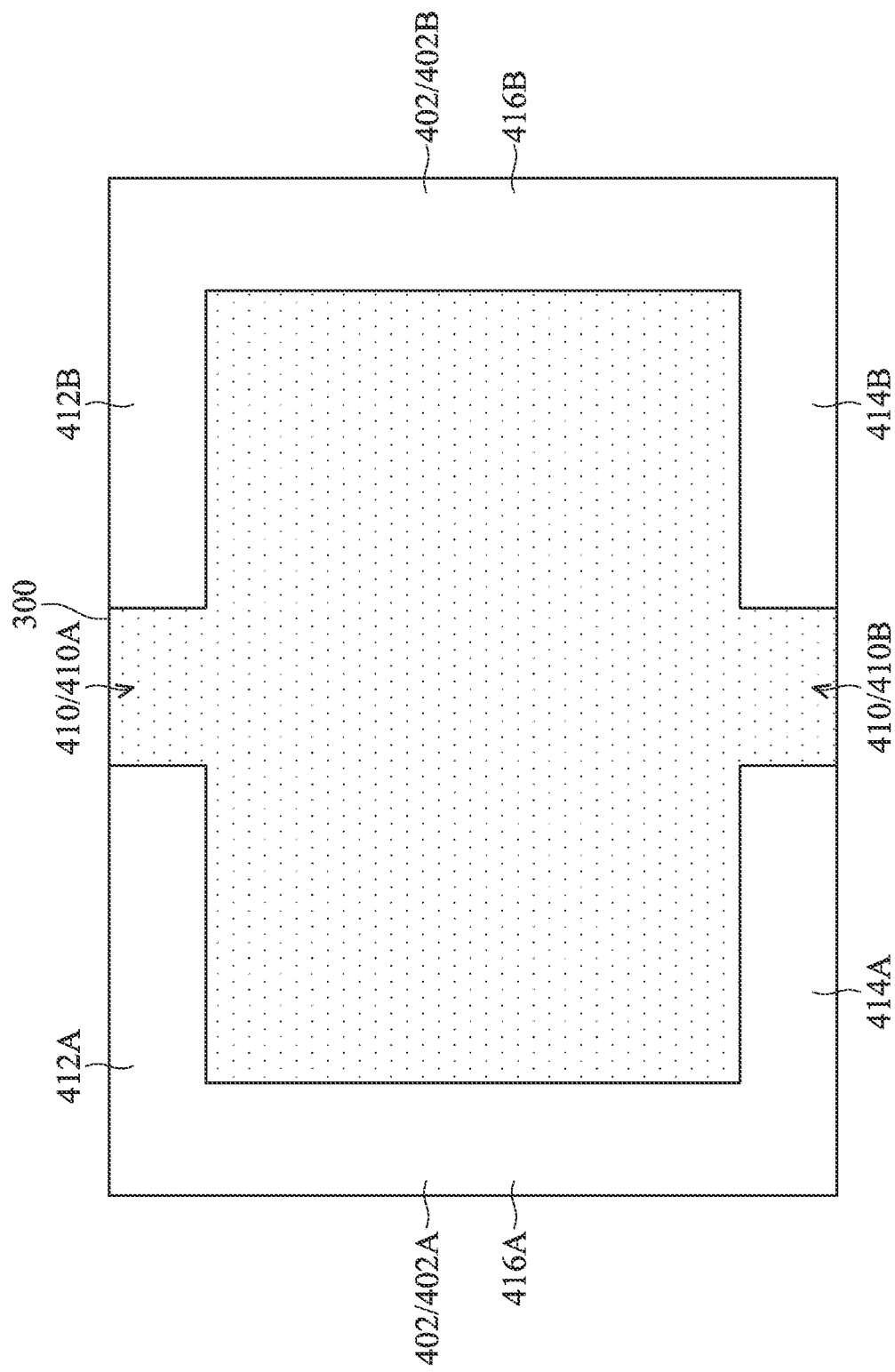

INTEGRATED CIRCUIT PACKAGE AND METHOD OF FORMING SAME

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-8, 9A-9C and 10A-10C illustrate top, bottom and cross-sectional views of intermediate stages in the manufacturing of integrated circuit packages, in accordance with some embodiments.

FIGS. 21A, 21B, 22A, 22B, 23A, and 23B illustrate top, bottom and cross-sectional views of intermediate stages in the manufacturing of integrated circuit packages, in accordance with some embodiments.

FIGS. 24A-24C, 25A, and 25B illustrate top, bottom and cross-sectional views of intermediate stages in the manufacturing of integrated circuit packages, in accordance with some embodiments.

DETAILED DESCRIPTION

Figure 1:
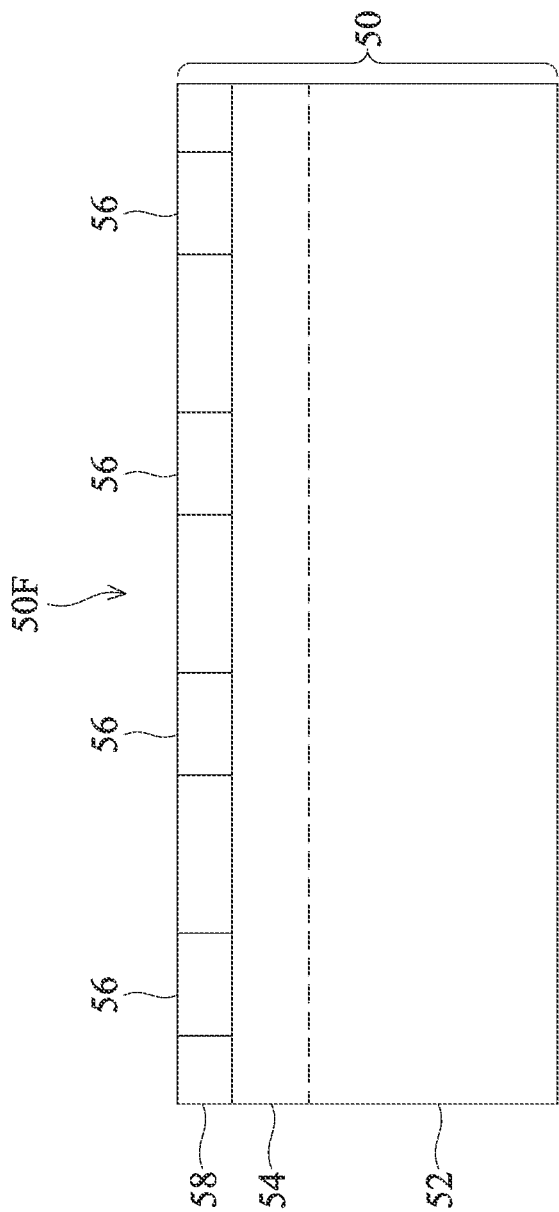
FIG. 1 illustrates a cross-sectional view of an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely integrated circuit packages, such as chip-on-wafer-on-substrate (CoWoS) packages, and methods of forming the same. According to various embodiments, integrated circuit packages are formed by packaging integrated circuit dies on a front-side surface of a wafer, such that a die-to-die underfill portion is formed in a gap between the adjacent integrated circuit dies in each package regions of the wafer. The wafer is singulated to form intermediate package components. After the package components are singulated, the package components are attached to top surfaces of package substrates to form the integrated circuit packages. After the package components are attached to the package substrates, warpage control structures are formed on the package substrates. A warpage control structure may comprise a front-side warpage control structure attached to the front-side surface of the package substrate and a backside warpage control structure embedded into the package substrate from a backside surface of the package substrate. The front-side warpage control structure may comprise a pair of first disconnected structures that extend along sidewalls of a package component that is attached to the front-side surface of the package substrate. The first disconnected structures may be separated by gaps that are disposed at opposing ends of the die-to-die underfill portion, with a width of the gaps being greater than a width of the die-to-die underfill portion. The backside warpage control structure may comprise a pair of second disconnected structures that are embedded into the package substrate from the backside surface of the package substrate. The second disconnected structures may be disposed such that the second disconnected structures overlap with opposing ends of the die-to-die underfill portion in a plan view. Forming the first disconnected structures of the front-side warpage control structure as described herein (having gaps with a width greater than a width of the die-to-die underfill portion) advantageously allows for stress relieving in the die-to-die underfill portion, and reducing or avoiding delamination of or crack formation in the die-to-die underfill portion. Forming the second disconnected structures of the backside warpage control structure as described herein (with the second disconnected structures overlapping with opposing ends (or edges) of the die-to-die underfill portion in a plan view) advantageously allows for reducing a package warpage caused by the gaps between the first disconnected structures of front-side warpage control structure.

FIG. 1 illustrates a cross-sectional view of an integrated circuit die 50, in accordance with some embodiments. Integrated circuit dies 50 will be packaged in subsequent processing to form integrated circuit packages. Each integrated circuit die 50 may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or a combination thereof (e.g., a system-on-a-chip (SoC) die). The integrated circuit die 50 may be formed in a wafer, which may include different die regions that are singulated in subsequent steps to form a plurality of integrated circuit dies 50. The integrated circuit die 50 includes a semiconductor substrate 52, an interconnect structure 54, die connectors 56, and an insulating layer 58.

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upward) and an inactive surface (e.g., the surface facing downward). Devices are at the active surface of the semiconductor substrate 52. The devices may be active devices (e.g., transistors, diodes, etc.), capacitors, resistors, etc. The inactive surface may be free from devices.

The interconnect structure 54 is over the active surface of the semiconductor substrate 52, and is used to electrically connect the devices of the semiconductor substrate 52 to form an integrated circuit. The interconnect structure 54 may include one or more dielectric layer(s) and respective metallization layer(s) in the dielectric layer(s). Acceptable dielectric materials for the dielectric layers include low-k dielectric materials such as phospho-silicate glass (PSG), boro-silicate glass (BSG), boron-doped phospho-silicate glass (BPSG), undoped silicate glass (USG), or the like. Acceptable dielectric materials for the dielectric layers further include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layers may include conductive vias and/or conductive lines to interconnect the devices of the semiconductor substrate 52. The metallization layers may be formed of a conductive material, such as a metal, such as copper, cobalt, aluminum, gold, combinations thereof, or the like. The interconnect structure 54 may be formed by a damascene process, such as a single damascene process, a dual damascene process, or the like.

Die connectors 56 are at the front-side 50F of the integrated circuit die 50. The die connectors 56 may be conductive pillars, pads, or the like, to which external connections are made. The die connectors 56 are in and/or on the interconnect structure 54. For example, the die connectors 56 may be part of an upper metallization layer of the interconnect structure 54. The die connectors 56 may be formed of a metal, such as copper, aluminum, or the like, and may be formed by, for example, plating, or the like.

Optionally, solder regions (not separately illustrated) may be disposed on the die connectors 56 during formation of the integrated circuit die 50. The solder regions may be used to perform chip probe (CP) testing on the integrated circuit die 50. For example, the solder regions may be solder balls, solder bumps, or the like, which are used to attach a chip probe to the die connectors 56. Chip probe testing may be performed on the integrated circuit die 50 to ascertain whether the integrated circuit die 50 is a known good die (KGD). Thus, only integrated circuit dies 50, which are KGDs, undergo subsequent processing and are packaged, and dies which fail the chip probe testing are not packaged. After testing, the solder regions may be removed in subsequent processing steps.

An insulating layer 58 is at the front-side 50F of the integrated circuit die 50. The insulating layer 58 is in and/or on the interconnect structure 54. For example, the insulating layer 58 may be an upper dielectric layer of the interconnect structure 54. The insulating layer 58 laterally encapsulates the die connectors 56. The insulating layer 58 may be an oxide, a nitride, a carbide, a polymer, the like, or a combination thereof. The insulating layer 58 may be formed, for example, by spin coating, lamination, chemical vapor deposition (CVD), or the like. Initially, the insulating layer 58 may bury the die connectors 56, such that the top surface of the insulating layer 58 is above the top surfaces of the die connectors 56. In some embodiments, the die connectors 56 are exposed through the insulating layer 58 during formation of the integrated circuit die 50. In other embodiments, the die connectors 56 are exposed through the insulating layer 58 during packaging of the integrated circuit die 50. Exposing the die connectors 56 may remove any solder regions that may be present on the die connectors 56. A removal process can be applied to the various layers to remove excess materials over the die connectors 56. The removal process may be a planarization process such as a chemical mechanical polish (CMP), an etch-back, combinations thereof, or the like. After the planarization process, top surfaces of the die connectors 56 and the insulating layer 58 are substantially coplanar (within process variations) such that they are level with one another. The die connectors 56 and the insulating layer 58 are exposed at the front-side 50F of the integrated circuit die 50.

In some embodiments, the integrated circuit die 50 is a stacked device that includes multiple semiconductor substrates 52. For example, the integrated circuit die 50 may be a memory device that includes multiple memory dies such as a hybrid memory cube (HMC) device, a high bandwidth memory (HBM) device, or the like. In such embodiments, the integrated circuit die 50 includes multiple semiconductor substrates 52 interconnected by through-substrate vias (TSVs) such as through-silicon vias. Each of the semiconductor substrates 52 may (or may not) have a separate interconnect structure 54.

Figure 8:
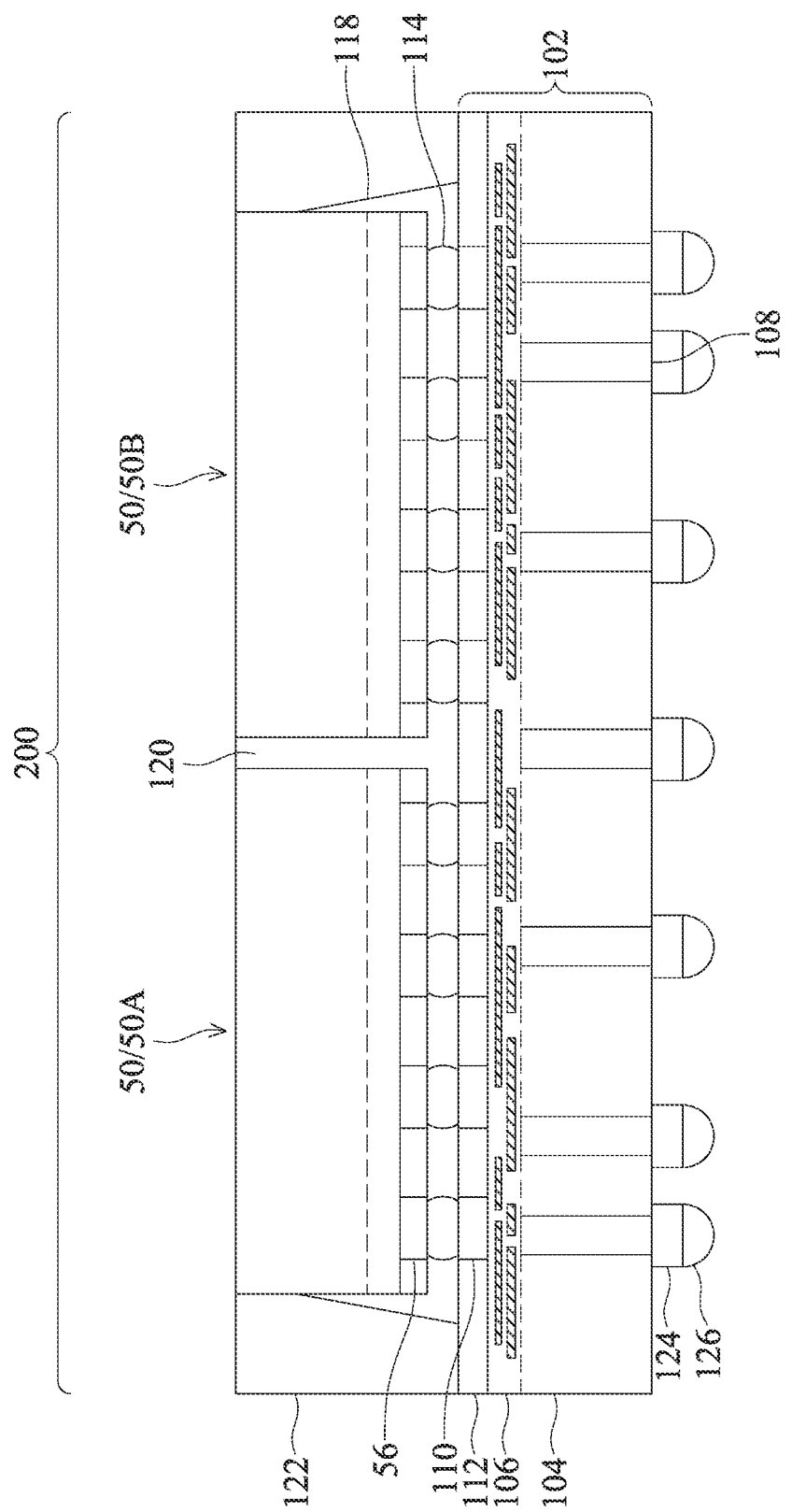
Figure 9A:
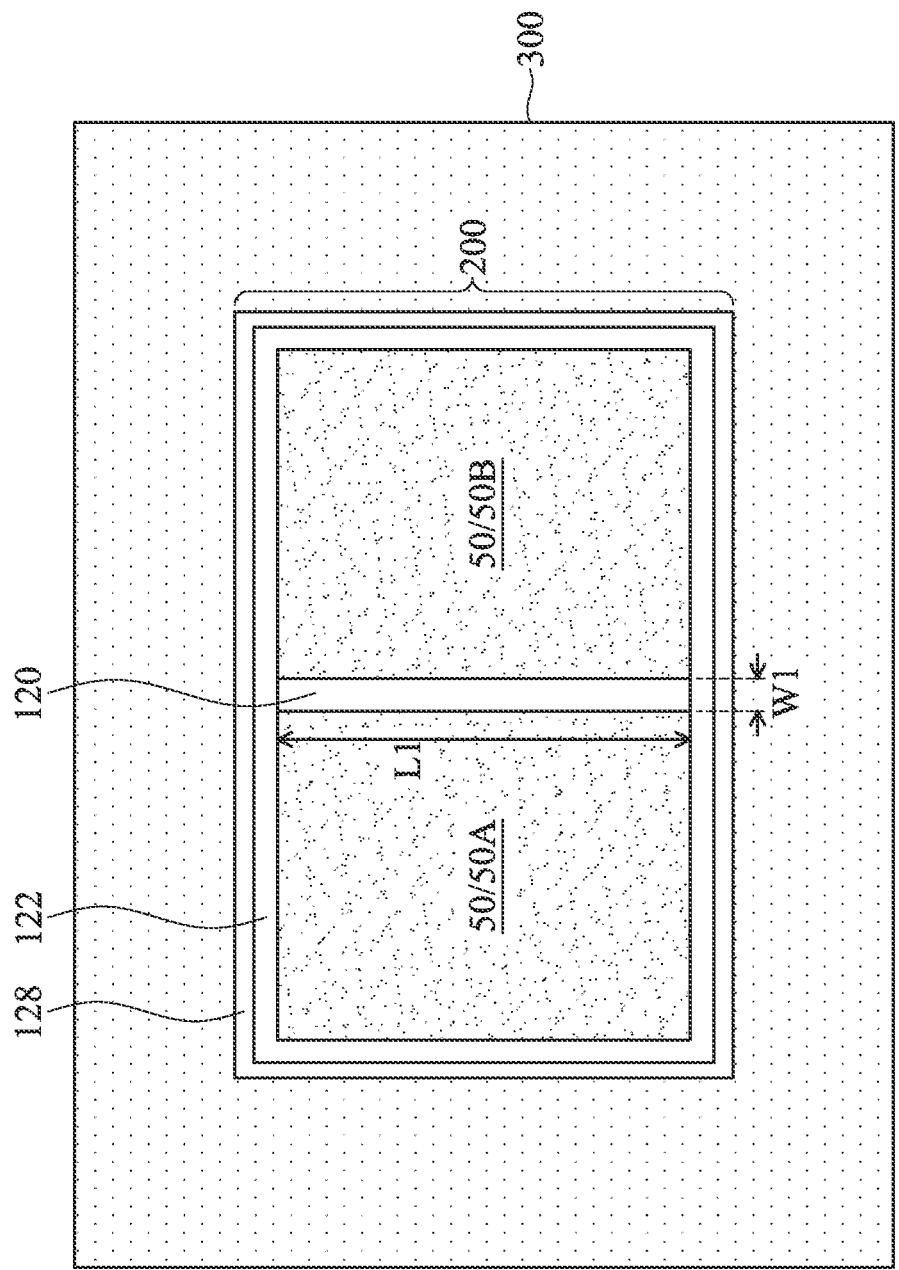
Figure 9B:
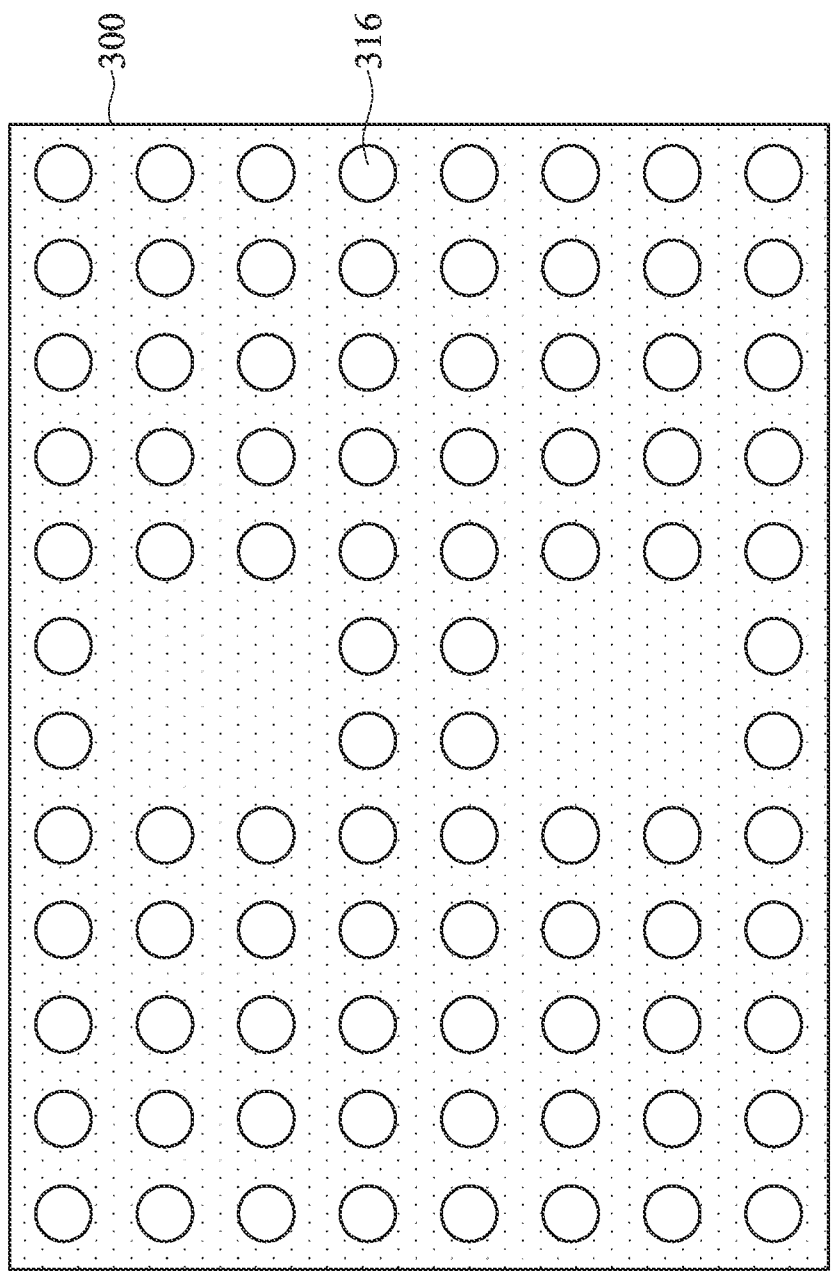
Figure 9C:
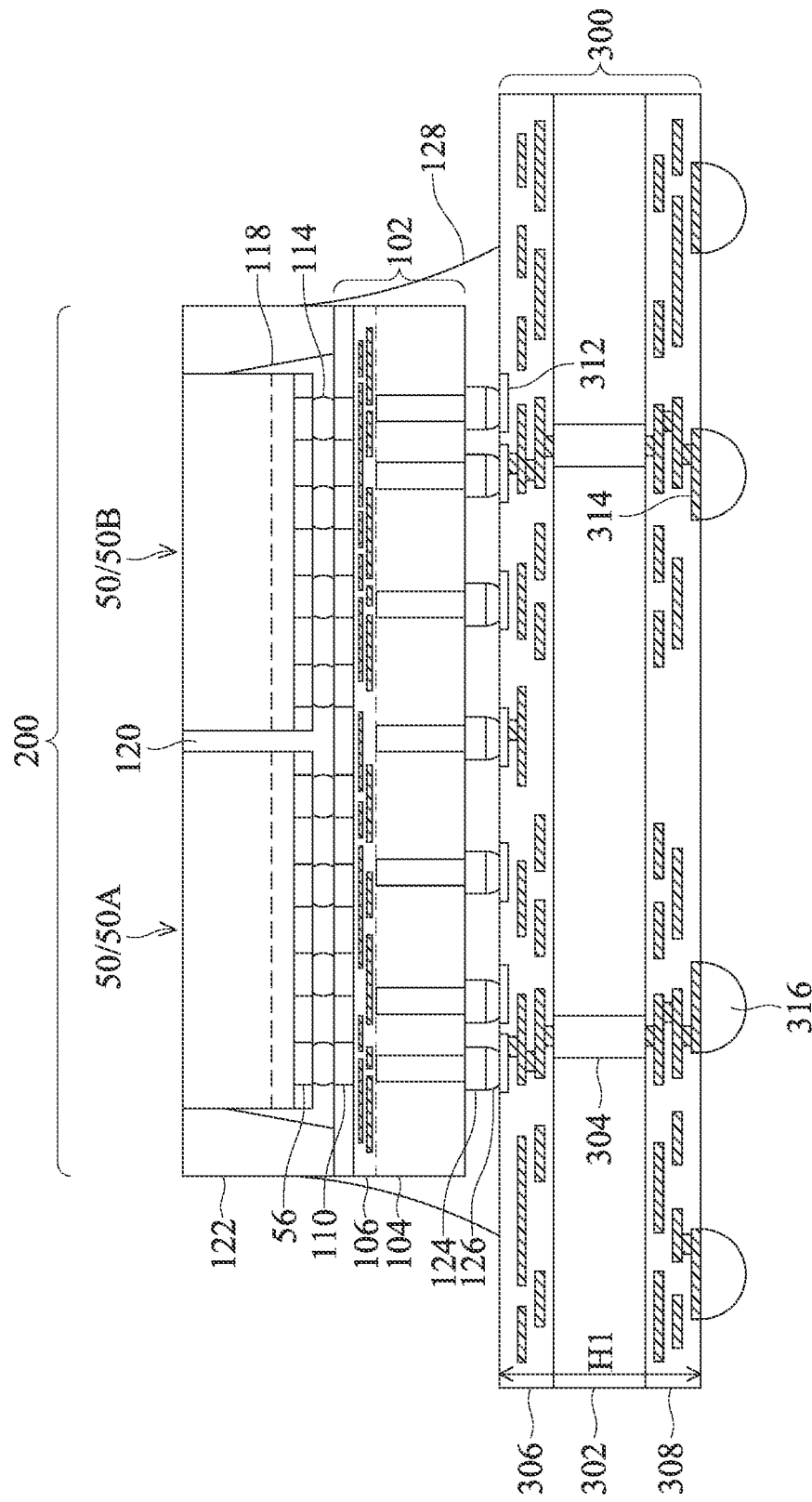
Figure 10A:
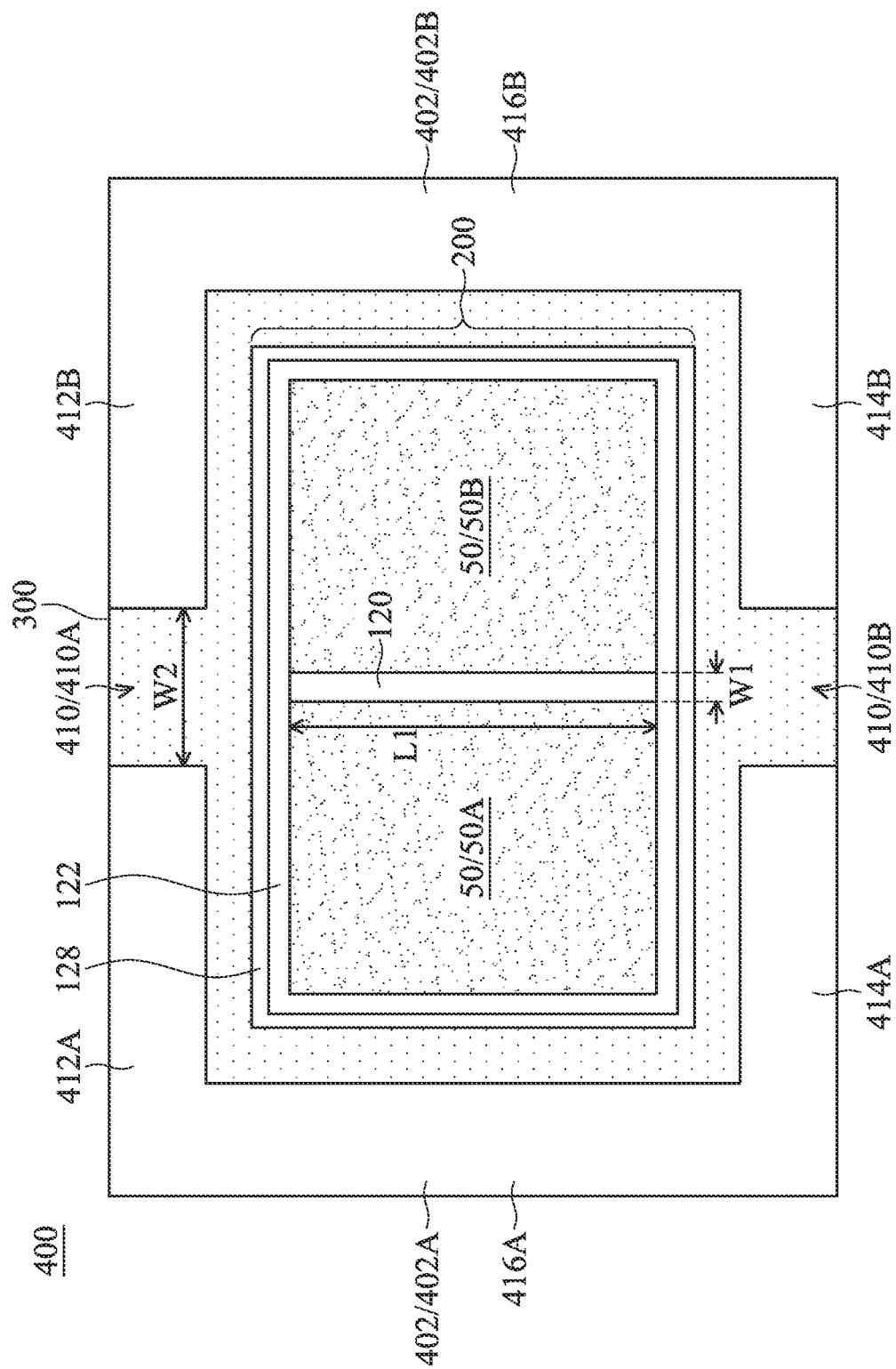
Figure 10C:
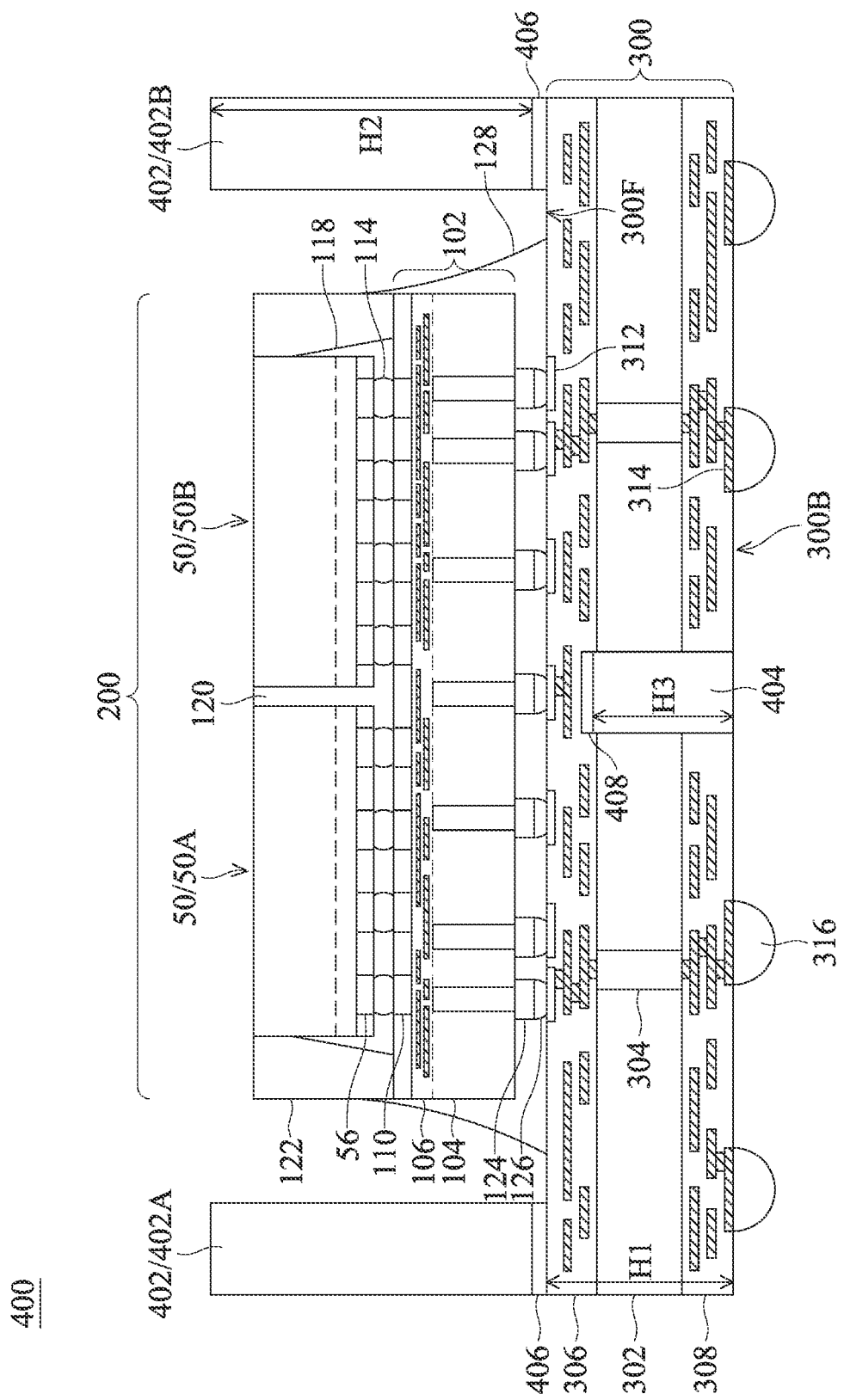

FIGS. 2-8, 9A-9C and 10A-10C illustrate top, bottom and cross-sectional views of intermediate stages in the manufacturing of integrated circuit packages 400, in accordance with some embodiments. FIGS. 2-8 illustrate cross-sectional views of intermediate stages in the manufacturing of package components 200 that include interposers. The package components 200 may be chip-on-wafer (CoW) package components. FIGS. 9A-9C and 10A-10C illustrate top, bottom and cross-sectional views of intermediate stages in the manufacturing of integrated circuit packages 400 using the package components 200. In particular, FIGS. 9A and 10A illustrate top views, FIGS. 9B and 10B illustrate bottom views, and FIGS. 9C and 10C illustrate cross-sectional views. The integrated circuit packages 400 may be chip-on-wafer-on-substrate (CoWoS) devices.

Figure 2:
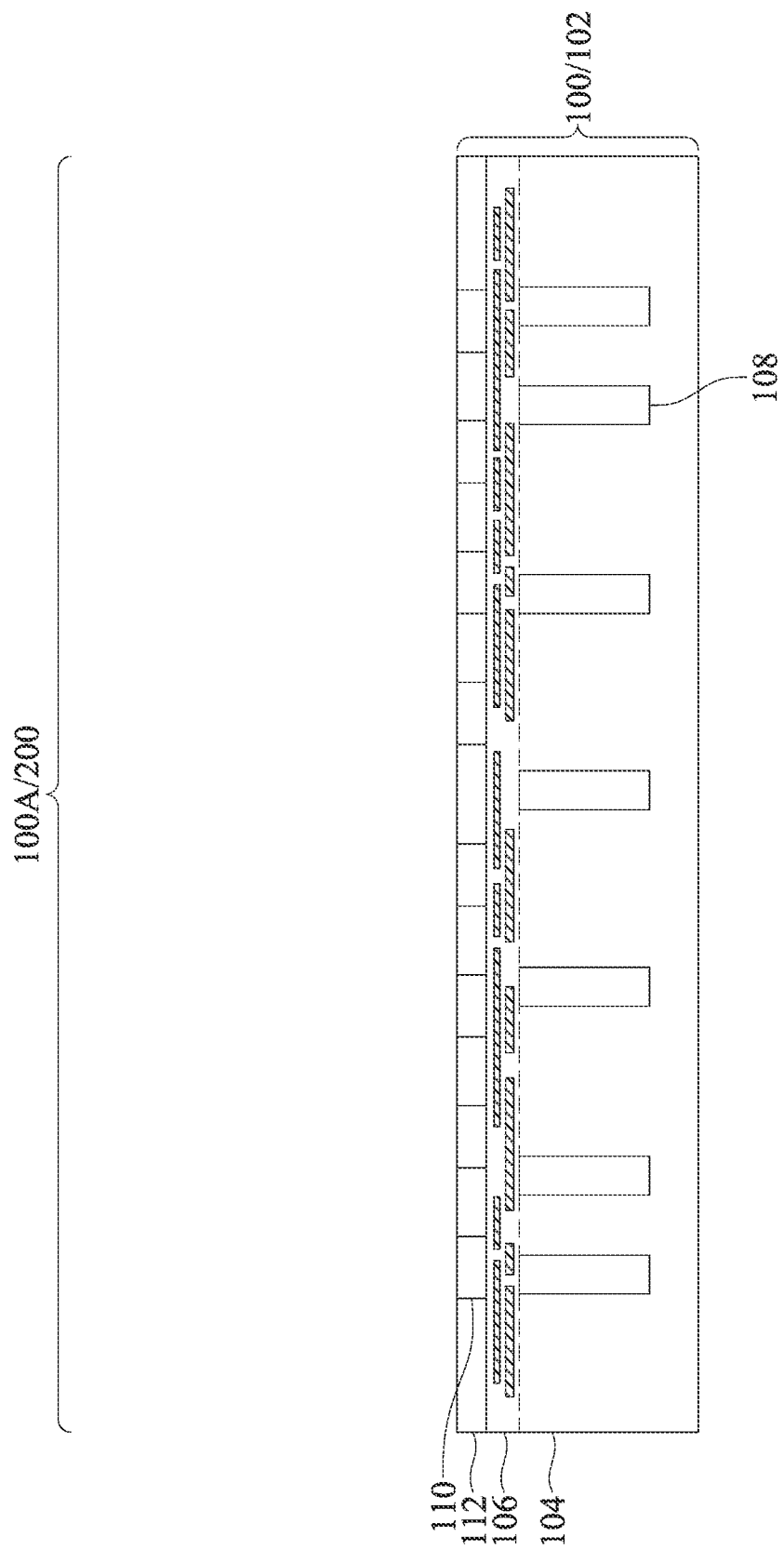

In FIG. 2, a wafer 100 is obtained or formed. The wafer 100 comprises a plurality of package regions such as the package region 100A. The wafer 100 comprises one or more devices in a package region (such as the package region 100A), which will be singulated in subsequent processing to be included in a package component 200. The devices in the wafer 100 may be interposers, integrated circuit dies, or the like. In some embodiments, interposers 102 are formed in the wafer 100, which include a substrate 104, an interconnect structure 106, and conductive vias 108.

The substrate 104 may be a bulk semiconductor substrate, a semiconductor-on-insulator (SOI) substrate, a multi-layered semiconductor substrate, or the like. The substrate 104 may include a semiconductor material, such as silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The substrate 104 may be doped or undoped. In embodiments where interposers are formed in the wafer 100, the substrate 104 generally does not include active devices therein, although the interposers may include passive devices formed in and/or on a front surface (e.g., the surface facing upward in FIG. 2) of the substrate 104. In embodiments where integrated circuit dies are formed in the wafer 100, active devices such as transistors, capacitors, resistors, diodes, and the like, may be formed in and/or on the front surface of the substrate 104.

The interconnect structure 106 is over the front surface of the substrate 104, and is used to electrically connect the devices (if any) of the substrate 104. The interconnect structure 106 may include one or more dielectric layer(s) and respective metallization layer(s) in the dielectric layer(s). The interconnect structure 106 may be formed using similar materials and methods as the interconnect structure 54 described above with reference to FIG. 1, and the description is not repeated herein.

In some embodiments, die connectors 110 and an insulating layer 112 are at the front-side of the wafer 100. Specifically, the wafer 100 may include die connectors 110 and an insulating layer 112 that are similar to those of the integrated circuit die 50 described above with reference to FIG. 1, and the description is not repeated herein. For example, the die connectors 110 and the insulating layer 112 may be part of an upper metallization layer of the interconnect structure 106.

The conductive vias 108 extend into the interconnect structure 106 and/or the substrate 104. The conductive vias 108 are electrically connected to metallization layer(s) of the interconnect structure 106. The conductive vias 108 are also sometimes referred to as through substrate vias (TSVs). As an example to form the conductive vias 108, recesses can be formed in the interconnect structure 106 and/or the substrate 104 by, for example, etching, milling, laser techniques, a combination thereof, and/or the like. A thin dielectric material may be formed in the recesses, such as by using an oxidation technique. A thin barrier layer may be conformally deposited in the openings, such as by CVD, atomic layer deposition (ALD), physical vapor deposition (PVD), thermal oxidation, a combination thereof, and/or the like. The barrier layer may be formed of an oxide, a nitride, a carbide, combinations thereof, or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from a surface of the interconnect structure 106 or the substrate 104 by, for example, a CMP. Remaining portions of the barrier layer and conductive material form the conductive vias 108.

Figure 3:
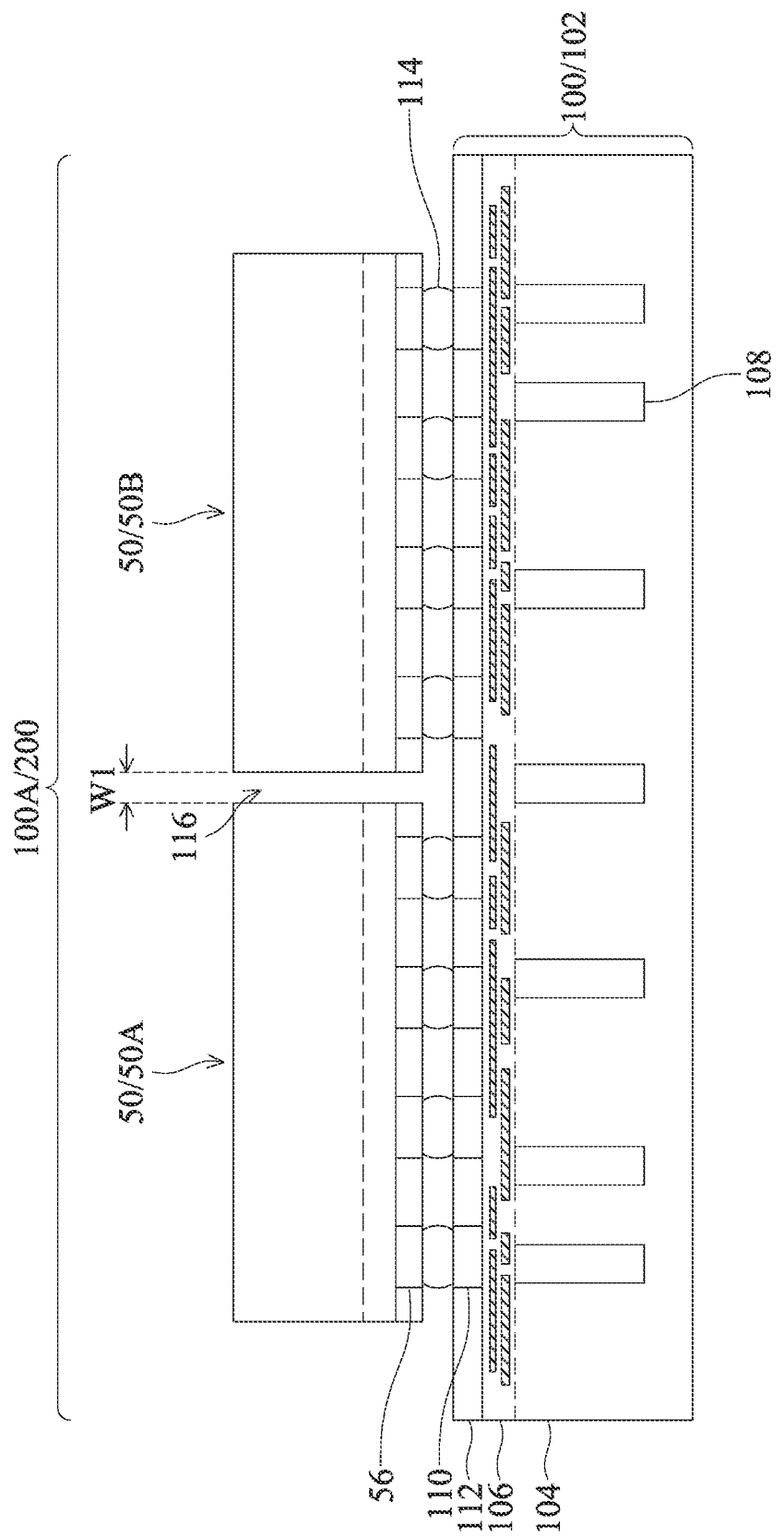

In FIG. 3, integrated circuit dies 50 (e.g., a first integrated circuit die 50A and a second integrated circuit die 50B) are attached to the wafer 100. In the embodiment shown, multiple integrated circuit dies 50 are placed adjacent to one another in the package region 100A. In some embodiments, the first integrated circuit die 50A is a logic device, such as a CPU, GPU, or the like, and the second integrated circuit die 50B is a memory device, such as DRAM dies, HMC modules, HBM modules, or the like. In some embodiments, the first integrated circuit die 50A is the same type of device (e.g., SoCs) as the second integrated circuit die 50B.

In the illustrated embodiment, the integrated circuit dies 50 are attached to the wafer 100 with solder bonds, such as with conductive connectors 114. The integrated circuit dies 50 may be placed on the interconnect structure 106 using, e.g., a pick-and-place tool. The conductive connectors 114 may be formed of a conductive material that is reflowable, such as solder, copper, aluminum, gold, nickel, silver, palladium, tin, the like, or a combination thereof. In some embodiments, the conductive connectors 114 are formed by initially forming a layer of solder through methods such as evaporation, electroplating, printing, solder transfer, ball placement, or the like. Once a layer of solder has been formed on the structure, a reflow may be performed in order to shape the conductive connectors 114 into desired bump shapes. Attaching the integrated circuit dies 50 to the wafer 100 may include placing the integrated circuit dies 50 on the wafer 100 and reflowing the conductive connectors 114. The conductive connectors 114 form joints between corresponding die connectors 110 of the wafer 100 and corresponding die connectors 56 of the integrated circuit dies 50, electrically connecting the interposer 102 to the integrated circuit dies 50. In some embodiments, the first integrated circuit die 50A and the second integrated circuit die 50B are laterally separated by a die-to-die gap 116. In some embodiments, the die-to-die gap 116 has a width W1 between about 30 μm and about 250 μm.

Figure 4:
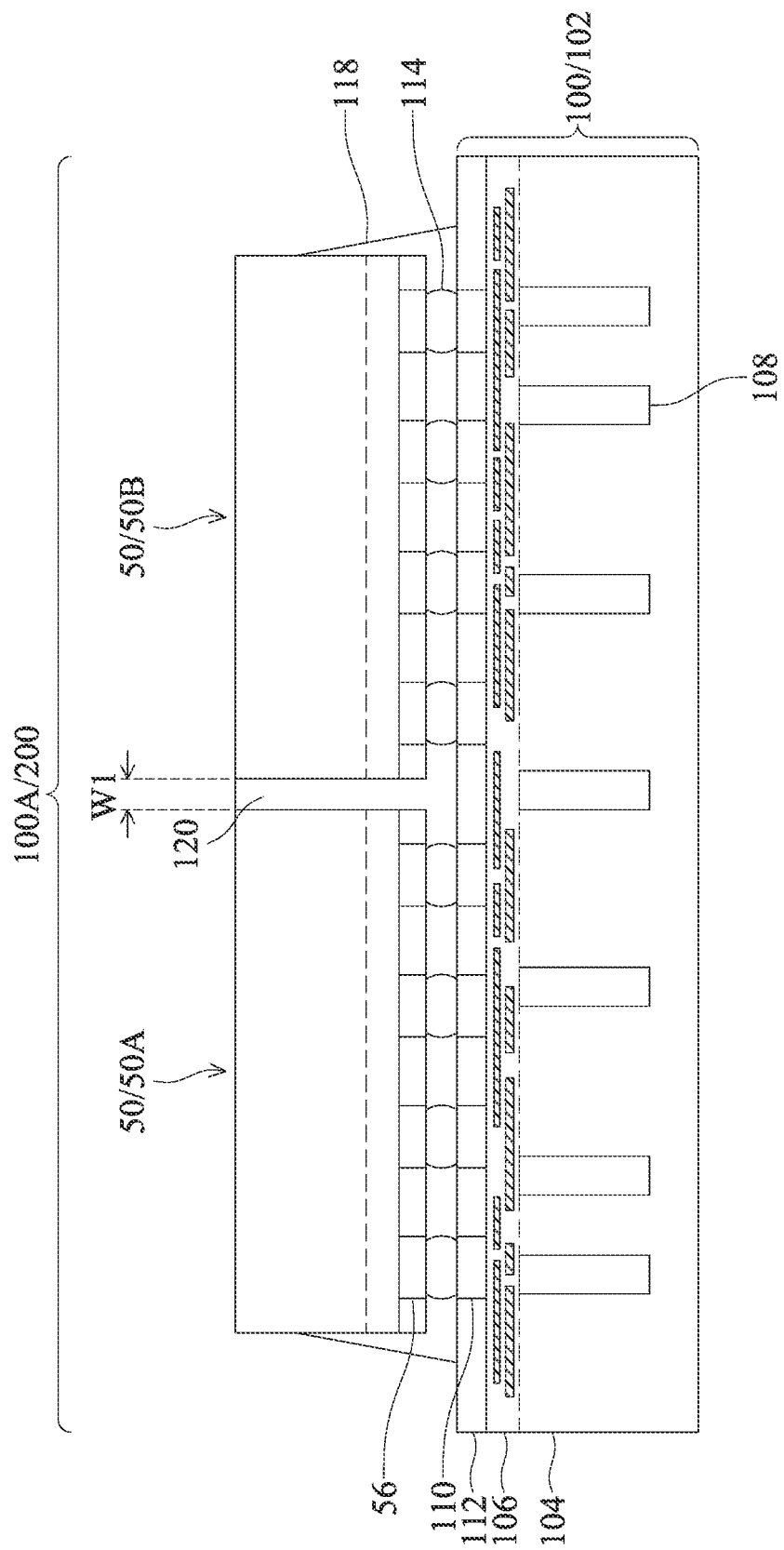

In FIG. 4, an underfill 118 may be formed around the conductive connectors 114, and between the wafer 100 and the integrated circuit dies 50. The underfill 118 may reduce stress and protect the joints resulting from the reflowing of the conductive connectors 114. The underfill 118 may be formed of an underfill material such as a molding compound, epoxy, or the like. The underfill 118 may be formed by a capillary flow process after the integrated circuit dies 50 are attached to the wafer 100, or may be formed by a suitable deposition method before the integrated circuit dies 50 are attached to the wafer 100. The underfill 118 may be applied in liquid or semi-liquid form and then subsequently cured. In some embodiments, the underfill 118 fills the die-to-die gap 116 (see FIG. 3) between the first integrated circuit die 50A and the second integrated circuit die 50B, and forms a die-to-die underfill portion 120 between the first integrated circuit die 50A and the second integrated circuit die 50B. In such embodiments, a width of the die-to-die underfill portion 120 is same as the width W1 of the die-to-die gap 116 (see FIG. 3). In some embodiments, a top surface of the die-to-die underfill portion 120 is level with a top surface of the first integrated circuit die 50A and a top surface of the second integrated circuit die 50B.

Figure 5:
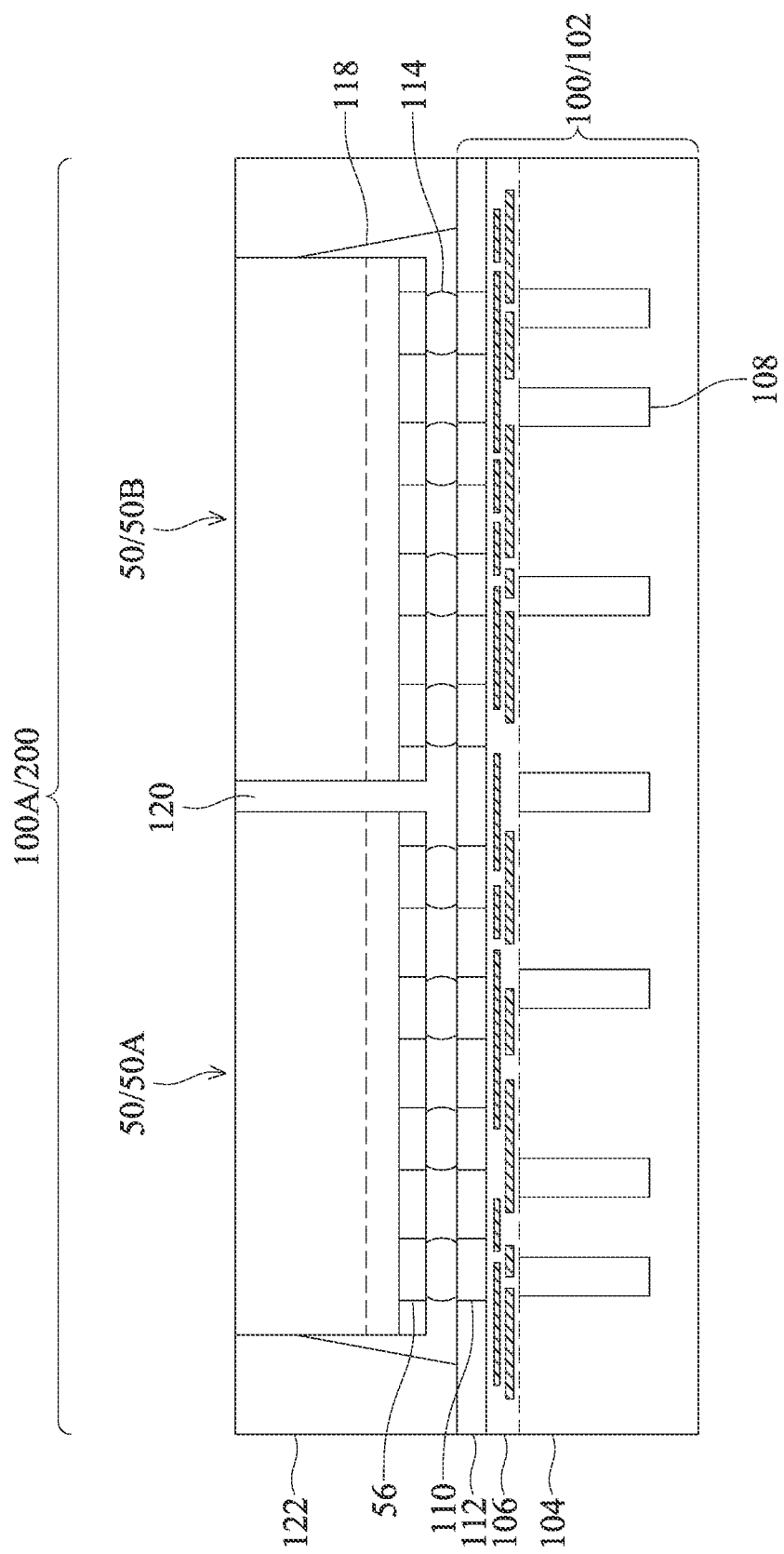

In FIG. 5, an encapsulant 122 is formed on and around the integrated circuit dies 50. After formation, the encapsulant 122 encapsulates the integrated circuit dies 50 and the underfill 118. The encapsulant 122 may be a molding compound, epoxy, or the like. The encapsulant 122 may be applied by compression molding, transfer molding, or the like, and is formed over the wafer 100 such that the integrated circuit dies 50 are buried or covered. The encapsulant 122 may be applied in liquid or semi-liquid form and then subsequently cured. The encapsulant 122 may be thinned to expose the integrated circuit dies 50. The thinning process may be a grinding process, a CMP, an etch-back, combinations thereof, or the like. After the thinning process, the top surfaces of the integrated circuit dies 50, the encapsulant 122, and the die-to-die underfill portion 120 are coplanar (within process variations) such that they are level with one another. The thinning is performed until a desired amount of the integrated circuit dies 50, the encapsulant 122, and/or the die-to-die underfill portion 120 has been removed.

Figure 6:
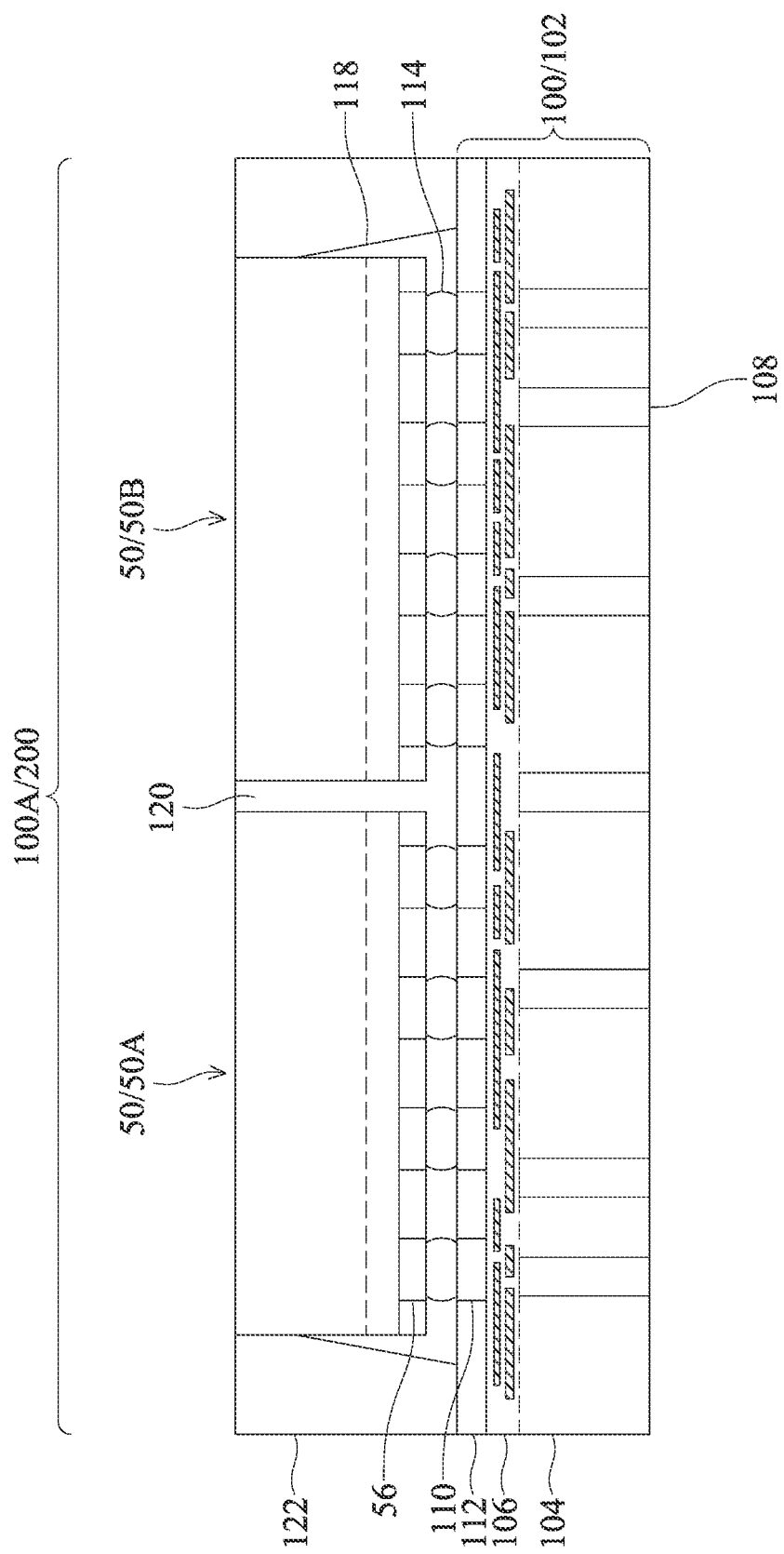

In FIG. 6, the substrate 104 is thinned to expose the conductive vias 108. Exposure of the conductive vias 108 may be accomplished by a thinning process, such as a grinding process, a CMP, an etch-back, combinations thereof, or the like. In some embodiments (not separately illustrated), the thinning process for exposing the conductive vias 108 includes a CMP, and the conductive vias 108 protrude at the back-side of the wafer 100 as a result of dishing that occurs during the CMP. In such embodiments, an insulating layer (not separately illustrated) may optionally be formed on the back surface of the substrate 104, surrounding the protruding portions of the conductive vias 108. The insulating layer may be formed of a silicon-containing insulator, such as, silicon nitride, silicon oxide, silicon oxynitride, or the like, and may be formed by a suitable deposition method such as spin coating, CVD, plasma-enhanced CVD (PECVD), high density plasma CVD (HDP-CVD), or the like. After the substrate 104 is thinned, the exposed surfaces of the conductive vias 108 and the insulating layer (if present) or the substrate 104 are coplanar (within process variations) such that they are level with one another, and are exposed at the back-side of the wafer 100.

Figure 7:
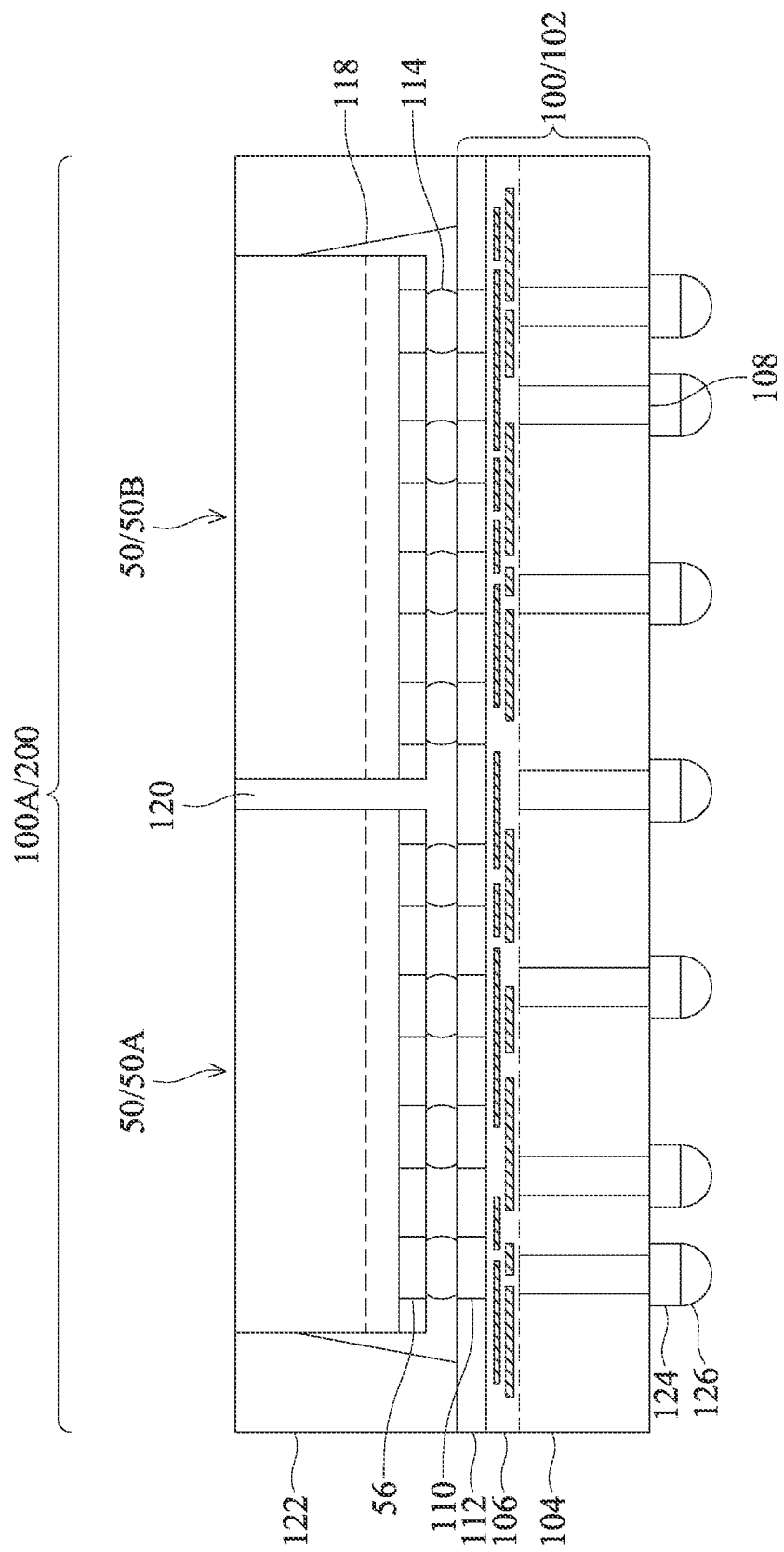

In FIG. 7, UBMs 124 are formed on the exposed surfaces of the conductive vias 108 and the substrate 104. As an example to form the UBMs 124, a seed layer (not separately illustrated) is formed over the exposed surfaces of the conductive vias 108 and the substrate 104. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 124. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, nickel, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs 124.

In some embodiments, the UBMs 124 may include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the UBMs 124. Any suitable materials or layers of material that may be used for the UBMs 124 are fully intended to be included within the scope of the current application.

Further, conductive connectors 126 are formed on the UBMs 124. The conductive connectors 126 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 126 may include a conductive material such as solder, copper, aluminum, gold, nickel, silver, palladium, tin, the like, or a combination thereof. In some embodiments, the conductive connectors 126 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 126 comprise metal pillars (such as copper pillars) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Further, a singulation process is performed by cutting along scribe line regions, e.g., around the package region 100A. The singulation process may include sawing, etching, dicing, a combination thereof, or the like. For example, the singulation process can include sawing the encapsulant 122, the interconnect structure 106, and the substrate 104. The singulation process singulates the package region 100A from adjacent package regions to form a singulated package component 200 as illustrated in FIG. 8. The resulting, singulated package component 200 is from the package region 100A. The singulation process forms interposers 102 from the singulated portions of the wafer 100. As a result of the singulation process, the outer sidewalls of the interposer 102 and the encapsulant 122 are laterally coterminous (within process variations) as illustrated in FIG. 8.

In FIGS. 9A, 9B and 9C, a package component 200 is attached to a package substrate 300 using the conductive connectors 126. In some embodiments, the package substrate 300 has a height H1 between about 0.5 mm and about 4 mm. The package substrate 300 includes a substrate core 302, which may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, or the like, may also be used. Additionally, the substrate core 302 may be a SOI substrate. Generally, an SOI substrate includes a layer of a semiconductor material such as epitaxial silicon, germanium, silicon germanium, SOI, SGOI, or combinations thereof. In another embodiment, the substrate core 302 is an insulating core such as a fiberglass reinforced resin core. One example core material is fiberglass resin such as FR4. Alternatives for the core material include bismaleimide-triazine (BT) resin, or alternatively, other printed circuit board (PCB) materials or films.

In some embodiments, the substrate core 302 may include active and passive devices (not separately illustrated). Devices such as transistors, capacitors, resistors, combinations thereof, and the like may be used to generate the structural and functional requirements of the design for the system. The devices may be formed using any suitable methods. In some embodiments, the substrate core 302 is substantially free of active and passive devices. In some embodiments, the substrate core 302 further includes through vias 304, which may be also referred to as TSVs. In some embodiments, the through vias 304 may be formed using similar materials and methods as the TSVs 108 described above with reference to FIG. 2, and the description is not repeated herein.

The package substrate 300 may also include an interconnect structure. The interconnect structure is designed to connect the various devices of the substrate core 302 to form functional circuitry. In some embodiments, the interconnect structure may be formed of alternating layers of dielectric material (e.g., low-k dielectric material) and conductive material (e.g., copper) with vias interconnecting the layers of conductive material, and may be formed through any suitable process (such as deposition, damascene, or the like). In other embodiments, the interconnect structure may be formed of alternating layers of dielectric material (e.g., build up films such as Ajinomoto build-up film (ABF) or other laminates) and conductive material (e.g., copper) with vias interconnecting the layers of conductive material, and may be formed through any suitable process (such as lamination, plating, or the like).

In the illustrated embodiment, the package substrate 300 comprises interconnect structures 306 and 308 formed on opposing surfaces of the substrate core 302, such that the substrate core 302 is interposed between the interconnect structure 306 and the interconnect structure 308. The through vias 304 electrically couple the interconnect structure 306 to the interconnect structure 308. In some embodiments, the interconnect structure 306 or the interconnect structure 308 may be omitted.

In some embodiments, the bond pads 312 are formed on the interconnect structure 306 and the bond pads 314 are formed on the interconnect structure 308. The bond pads 312 and 314 may be also referred to as UBMs. In some embodiments, the bond pads 312 and 314 may be formed using similar materials and methods as the UBMs 124 described above with reference to FIG. 7, and the description is not repeated herein.

In some embodiments, conductive connectors 316 are formed on the bond pads 314. The conductive connectors 316 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 316 may be formed using similar materials and methods as the conductive connectors 126 described above with reference to FIG. 7, and the description is not repeated herein.

In some embodiments, the conductive connectors 126 are reflowed to attach the UBMs 124 to the bond pads 312. The conductive connectors 126 connect the package component 200, including the interposer 102, to the package substrate 300. Thus, the package substrate 300 is electrically connected to the integrated circuit dies 50.

In some embodiments, an underfill 128 is formed between the package component 200 and the package substrate 300, surrounding the conductive connectors 126. The underfill 128 may be formed by a capillary flow process after the package component 200 is attached or may be formed by any suitable deposition method before the package component 200 is attached. The underfill 128 may be a continuous material extending from the package substrate 300 to the interposer 102. In some embodiments, the underfill 128 extends along and is in physical contact with sidewalls of the interposer 102 and sidewalls of the encapsulant 122. In some embodiments, the underfill 128 may be formed using similar materials and method as the underfill 118 described above with reference to FIG. 4, and the description is not repeated herein.

Referring further to FIG. 9A, in some embodiments, the die-to-die underfill portion 120 has a shape of a bar, or a shape an elongated rectangle. In such embodiments, the die-to-die underfill portion 120 has a length L1 and a width W1. The length L1 may be between about 1 cm and about 10 cm. A ratio of the length L1 to the width W1 (L1/W1) is between about 33 and about 10000.

In FIGS. 10A, 10B and 10C, after bonding the package component 200 to the package substrate 300, a warpage control structure is attached to the package substrate 300. The warpage control structure is used to control or reduce warpage of the integrated circuit package 400. In some embodiments, the warpage control structure comprises a front-side warpage control structure 402 and a backside warpage control structure 404. In some embodiment, the front-side warpage control structure 402 is attached to a front side 300F of the package substrate 300 by an adhesive 406. The adhesive 406 may comprise a polymer material.

In some embodiments, the front-side warpage control structure 402 may comprise a high coefficient of thermal expansion (CTE) material, such as copper, stainless steel, a combination thereof, or the like. In some embodiments, a material of the front-side warpage control structure 402 may have a CTE between about 10 ppm/° C. and about 25 ppm/° C. In some embodiments, the front-side warpage control structure 402 comprise disconnected portions. In the illustrated embodiment, the front-side warpage control structure 402 comprises a first disconnected portion 402A and a second disconnected portion 402B that are separated by gaps 410. In some embodiments, the first disconnected portion 402A and the second disconnected portion 402B of the front-side warpage control structure 402 are formed and are subsequently attached to the front side 300F of the package substrate 300. In some embodiments, a height of the first disconnected portion 402A and a height the second disconnected portion 402B of the front-side warpage control structure 402 are greater than a height of the package component 200. In such embodiments, top surfaces of the first disconnected portion 402A and the second disconnected portion 402B of the front-side warpage control structure 402 are above a top surface of the package component 200. The first disconnected portion 402A and the second disconnected portion 402B of the front-side warpage control structure 402 may have a height H2 between about 0.5 mm and about 5 mm.

In some embodiments, the first disconnected portion 402A of the front-side warpage control structure 402 comprises a first portion 412A, a second portion 414A, and a third portion 416A connecting the first portion 412A to the second portion 414A, and the second disconnected portion 402B of the front-side warpage control structure 402 comprises a first portion 412B, a second portion 414B, and a third portion 416B connecting the first portion 412B to the second portion 414B. The first portion 412A may be parallel to the second portion 414A, with the third portion 416A being perpendicular to both the first portion 412A and the second portion 414A. The first portion 412B may be parallel to the second portion 414B, with the third portion 416B being perpendicular to both the first portion 412B and the second portion 414B. In some embodiments, the first disconnected portion 402A and the second disconnected portion 402B of the front-side warpage control structure 402 are attached to the package substrate 300, such that sidewalls of the first portions 412A and 412B that face away from the package component 200 are coplanar with a first sidewall of the package substrate 300, sidewalls of the second portions 414A and 414B that face away from the package component 200 are coplanar with a second sidewall of the package substrate 300 (with the second sidewall being opposite to the first sidewall), a sidewall of the third portion 416A that face away from the package component 200 is coplanar with a third sidewall of the package substrate 300 (with the third sidewall connecting the first sidewall to the second sidewall), and a sidewall of the third portion 416B that face away from the package component 200 is coplanar with a fourth sidewall of the package substrate 300 (with the fourth sidewall being opposite to the third sidewall).

In some embodiments, a first gap 410A is disposed between the first portion 412A of the first disconnected portion 402A and the first portion 412B of the second disconnected portion 402B, and a second gap 410B is disposed between the second portion 414A of the first disconnected portion 402A and the second portion 414B of the second disconnected portion 402B. The first gap 410A is disposed at or near a first end of the die-to-die underfill portion 120 and the second gap 410B is disposed at or near a second end (opposite to the first end) of the die-to-die underfill portion 120. In some embodiments, the gaps 410 have a uniform or a constant width as the gaps 410 extend from respective sidewalls of the package substrate 300 toward the package component 200 as illustrated in FIG. 10A. In some embodiments, a sidewall of the first portion 412A of the first disconnected portion 402A of the front-side warpage control structure 402 and a sidewall of the first portion 412B of the second disconnected portion 402B of the front-side warpage control structure 402 that face each other across the first gap 410A are parallel to a respective sidewall of the package substrate 300, and a sidewall of the second portion 414A of the first disconnected portion 402A of the front-side warpage control structure 402 and a sidewall of the second portion 414B of the second disconnected portion 402B of the front-side warpage control structure 402 that face each other across the second gap 410B are parallel to a respective sidewall of the package substrate 300.

The gaps 410 may have a width W2 between about 30 μm and about 100000 μm. In some embodiments, the width W2 of the gaps 410 are greater than the width W1 of the die-to-die underfill portions 120. A ratio of the width W2 to the width W1 (W2/W1) may be between about 1 and about 3333. Forming the gaps 410 that separate the first disconnected portion 402A and the second disconnected portion 402B of the front-side warpage control structure 402 advantageously allows for stress relieving in the die-to-die underfill portion 120, and reducing or avoiding delamination of or crack formation in the die-to-die underfill portion 120 at the opposite edges of the die-to-die underfill portion 120.

Further in FIGS. 10A, 10B and 10C, the backside warpage control structure 404 is embedded into the package substrate 300 and is attached to the package substrate 300 by an adhesive 408. The adhesive 408 may be interposed between the interconnect structure 306 of the package substrate 300 and the backside warpage control structure 404. The adhesive 408 may be formed using similar materials as the adhesive 406. The backside warpage control structure 404 may be embedded in the package substrate 300 from the backside 300B of the package substrate 300. In the illustrated embodiment, the backside warpage control structure 404 extends through the interconnect structure 308 and the substrate core 302 of the package substrate 300, and into the interconnect structure 306 of the package substrate 300, such that a top surface of the backside warpage control structure 404 is within the interconnect structure 306 of the package substrate 300. In some embodiments, the backside warpage control structure 404 may extend through the interconnect structure 308 and into the substrate core 302 of the package substrate 300, such that a top surface of the backside warpage control structure 404 is within the substrate core 302 of the package substrate 300. In other embodiments, the backside warpage control structure 404 may extend into the interconnect structure 308 of the package substrate 300, such that a top surface of the backside warpage control structure 404 is within the interconnect structure 308 of the package substrate 300.

The height H1 of the package substrate 300 may be greater than a height H3 of the backside warpage control structure 404. The height H3 may be between about 0.1 mm and about 3.5 mm. A ratio of the height H3 to the height H1 may be between about 0.15 and about 1.

The backside warpage control structure 404 may comprise a low CTE material, such as nickel-iron alloy, silicon, or the like. A material of the backside warpage control structure 404 may have a CTE less than about 3 ppm/° C. In some embodiments, a CTE of the front-side warpage control structure 402 is greater than a CTE of the backside warpage control structure 404.

The backside warpage control structure 404 may comprise disconnected portions. In the illustrated embodiment, the backside warpage control structure 404 comprises a first disconnected portion 404A and a second disconnected portion 404B. The first disconnected portion 404A and the second disconnected portion 404B may be laterally separated from each other by a distance D1. The distance D1 may be between about 1 mm and about 100 mm.

In some embodiments, a formation process for the backside warpage control structure 404 may include patterning the package substrate 300 to form openings for the first disconnected portion 404A and the second disconnected portion 404B in the package substrate 300. The openings extend from the backside 300B of the package substrate 300 into the package substrate 300. In some embodiments, the package substrate 300 is formed such that a circuitry of the package substrate 300 (including active/passive devices, interconnects, and/or bond pads) is re-routed away from regions of the package substrate 300 where the opening are formed. In such embodiments, the regions of the package substrate 300 where the openings are formed are substantially free from the circuitry of the package substrate 300. Subsequently, the first disconnected portion 404A and the second disconnected portion 404B are inserted into respective openings and are attached to the package substrate 300 using the adhesive 408.

In some embodiment, the first disconnected portion 404A and the second disconnected portion 404B of the backside warpage control structure 404 may be embedded into the package substrate 300, such that the first disconnected portion 404A is directly below and overlaps with a first end of the die-to-die underfill portion 120 in a plan view, and such that the second disconnected portion 404B is directly below and overlaps with a second end (opposite to the first end) of the die-to-die underfill portion 120 in the plan view as illustrated in FIG. 10B.

Forming the first disconnected portion 404A and the second disconnected portion 404B of the backside warpage control structure 404 as described above (such that the first disconnected portion 404A and the second disconnected portion 404B of the backside warpage control structure 404 overlap with opposite ends of the die-to-die underfill portion 120 in a plan view) advantageously allows for reducing a package warpage that may be caused by gaps 410 that are formed between the first disconnected portions 402A and the second disconnected portions 402B of the front-side warpage control structure 402.

In the illustrated embodiment, the first disconnected portion 404A and the second disconnected portion 404B of the backside warpage control structure 404 have a rectangular shape in a plan view as illustrated in FIG. 10B. In other embodiments, the first disconnected portion 404A and the second disconnected portion 404B of the backside warpage control structure 404 may have varying shapes based on design specifications of the integrated circuit package 400. Each of the first disconnected portion 404A and the second disconnected portion 404B of the backside warpage control structure 404 has a width W3 and a length L2. In some embodiments, the width W3 is same as the length L2. In other embodiments, the width W3 is different from the length L2. The width W3 may be between about 0.15 cm and about 6.25 cm. The length L2 may be between about 0.1 cm and about 5 cm. In some embodiments, the width W3 of the first disconnected portion 404A and the second disconnected portion 404B of the backside warpage control structure 404 is greater than the width W1 of the die-to-die underfill portion 120. A ratio of the width W3 to the width W1 (W3/W1) may be between about 50 and about 250. In some embodiments, the length L2 of the first disconnected portion 404A and the second disconnected portion 404B of the backside warpage control structure 404 is less than the length L1 of the die-to-die underfill portion 120. A ratio of the length L2 to the length L1 (L2/L1) may be between about 0 and about 0.5.

Figure 11:
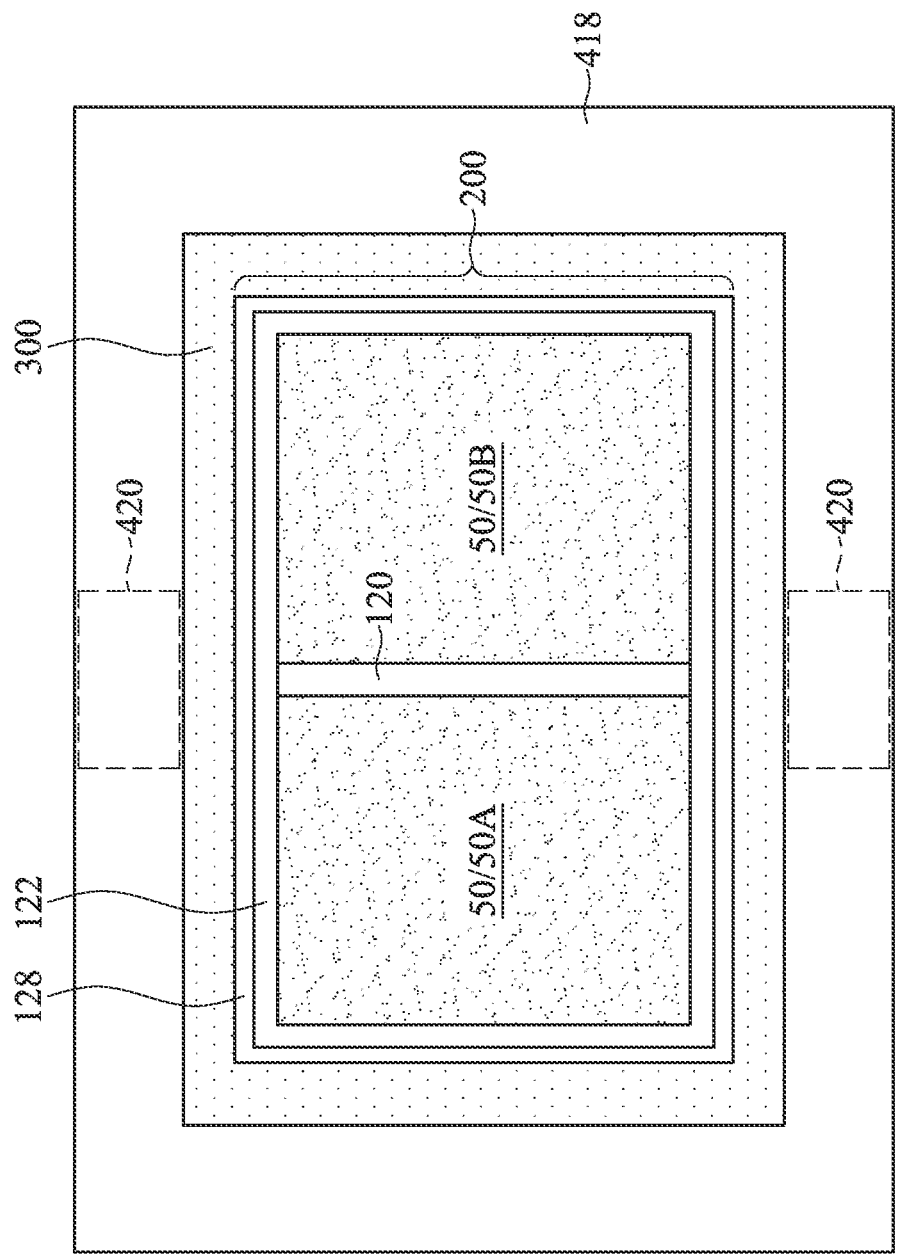
FIG. 11 illustrates a top view of an intermediate stage in the manufacturing of integrated circuit packages, in accordance with some embodiments.

FIG. 11 illustrates a top view of an intermediate stage in the manufacturing of integrated circuit packages, in accordance with some embodiments. In particular, FIG. 11 illustrates a process for forming the front-side warpage control structure 402 (see FIGS. 10A, 10B and 10C), in accordance with some embodiments. In some embodiments, the front-side warpage control structure 402 is formed by attaching an annular structure 418 to the front side 300F (see FIG. 10C) of the package substrate 300 and subsequently removing portions 420 of the annular structure 418 to form gaps 410 (see FIG. 10A). The removal process may be any suitable removal process, such as etching, milling, or the like. In some embodiments, the annular structure 418 is attached to the front side 300F of the package substrate 300, such that outer sidewalls of the annular structure 418 are coplanar with respective sidewalls of the package substrate 300. In some embodiments, outer sidewalls of the annular structure 418 and respective sidewalls of the package substrate 300 are laterally coterminous. The annular structure 418 may comprise a high CTE material, such as copper, stainless steel, or the like. In some embodiments, a material of the annular structure 418 may have a CTE between about 10 ppm/° C. and about 25 ppm/° C.

Figure 12:
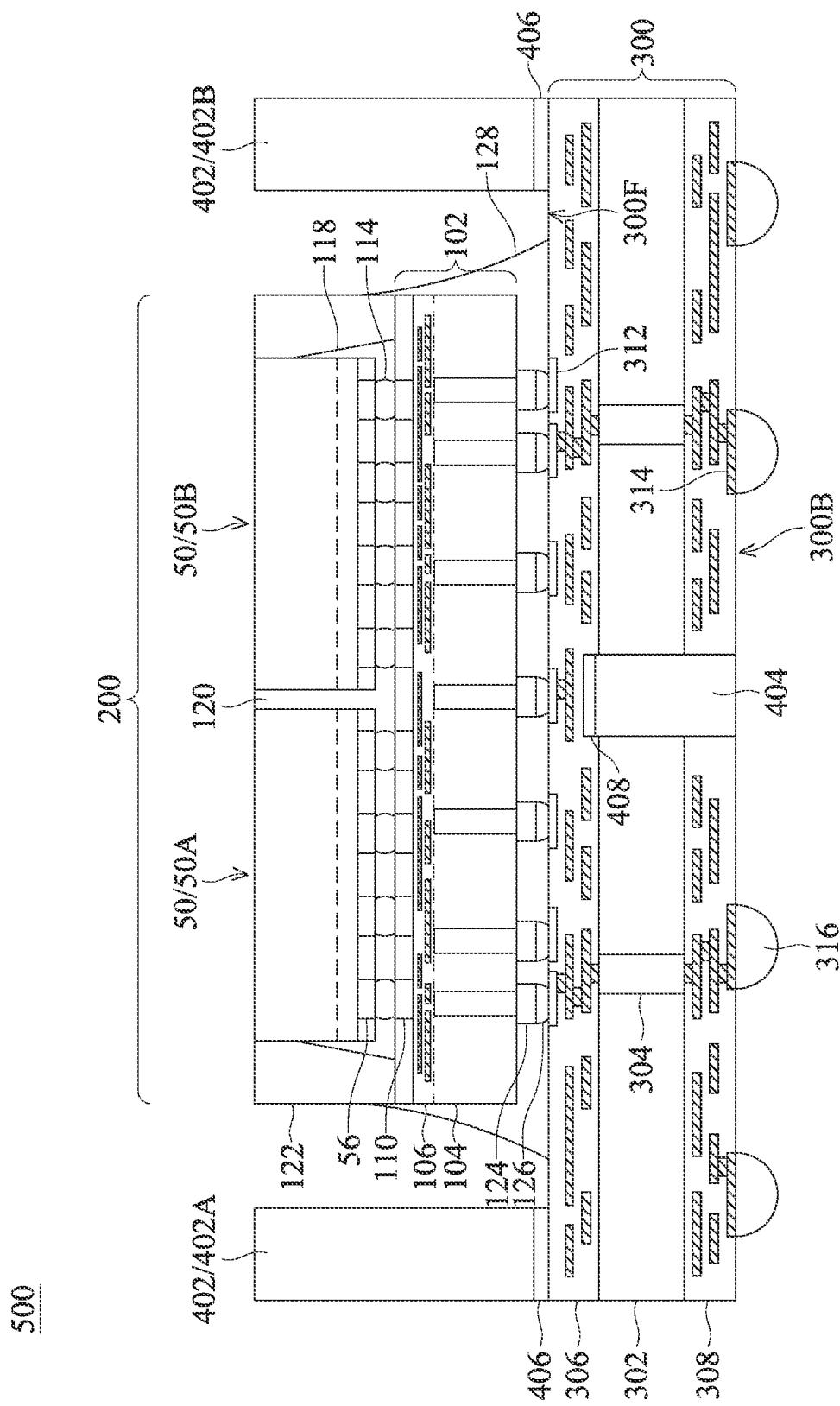
FIG. 12 illustrates a cross-sectional view of an integrated circuit package, in accordance with some embodiments.

FIG. 12 illustrates a cross-sectional view of an integrated circuit package 500, in accordance with some embodiments. The integrated circuit package 500 is similar to the integrated circuit package 400 (see FIGS. 10A, 10B and 10C), with similar features being labeled by similar numerical references, and descriptions of the similar features are not repeated herein. In some embodiments, the integrated circuit package 500 may be formed by process steps that are similar to the process steps described above with reference to FIGS. 2-8, 9A-9C and 10A-10C, and the description is not repeated herein. In the illustrated embodiment, a height of the first disconnected portion 402A and a height the second disconnected portion 402B of the front-side warpage control structure 402 are same as a height of the package component 200. In such embodiments, top surfaces of the first disconnected portion 402A and the second disconnected portion 402B of the front-side warpage control structure 402 are level with a top surface of the package component 200.

Figure 13:
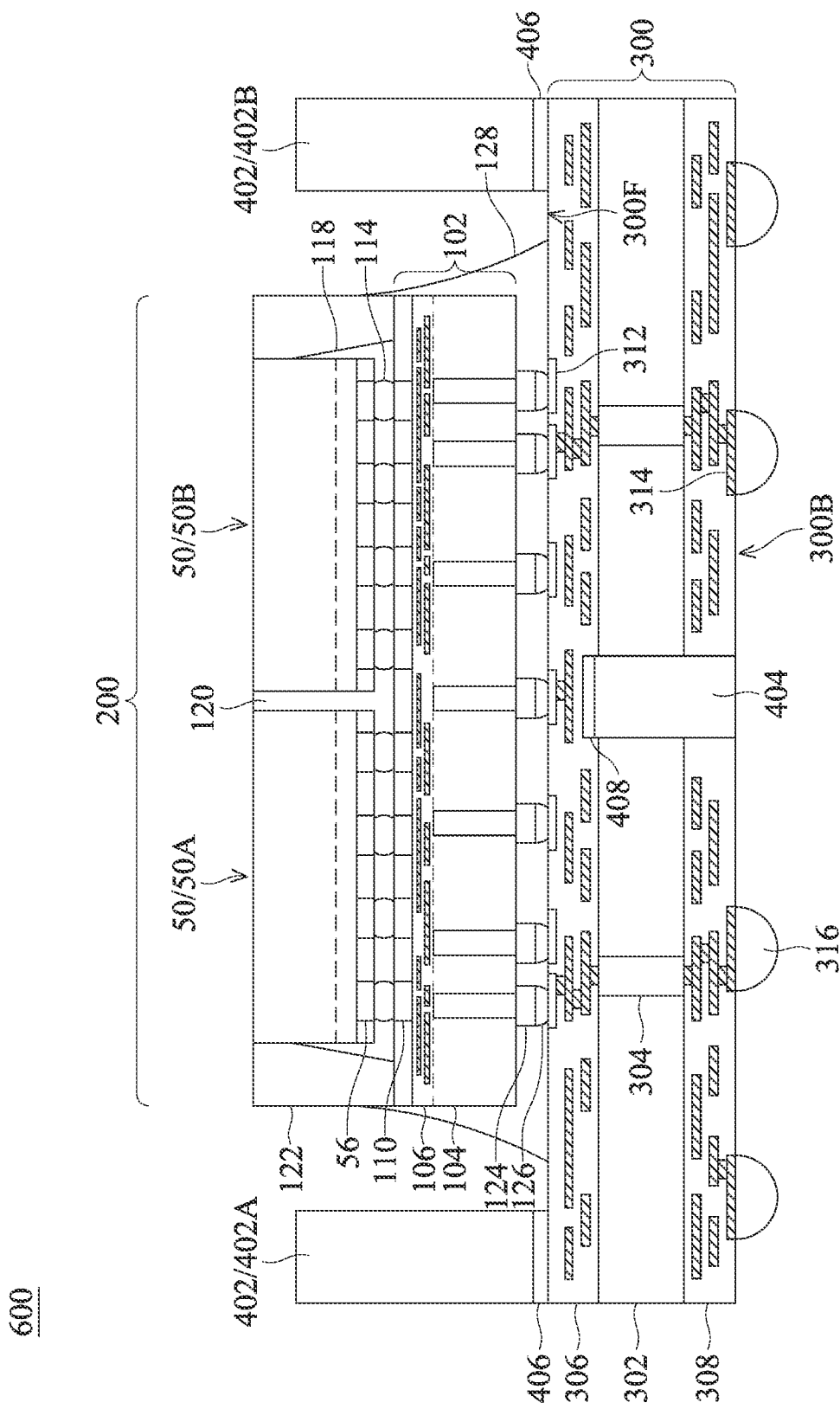
FIG. 13 illustrates a cross-sectional view of an integrated circuit package, in accordance with some embodiments.

FIG. 13 illustrates a cross-sectional view of an integrated circuit package 600, in accordance with some embodiments. The integrated circuit package 600 is similar to the integrated circuit package 400 (see FIGS. 10A, 10B and 10C), with similar features being labeled by similar numerical references, and descriptions of the similar features are not repeated herein. In some embodiments, the integrated circuit package 600 may be formed by process steps that are similar to the process steps described above with reference to FIGS. 2-8, 9A-9C and 10A-10C, and the description is not repeated herein. In the illustrated embodiment, a height of the first disconnected portion 402A and a height the second disconnected portion 402B of the front-side warpage control structure 402 are less than a height of the package component 200. In such embodiments, top surfaces of the first disconnected portion 402A and the second disconnected portion 402B of the front-side warpage control structure 402 are lower than with a top surface of the package component 200.

Figure 14:
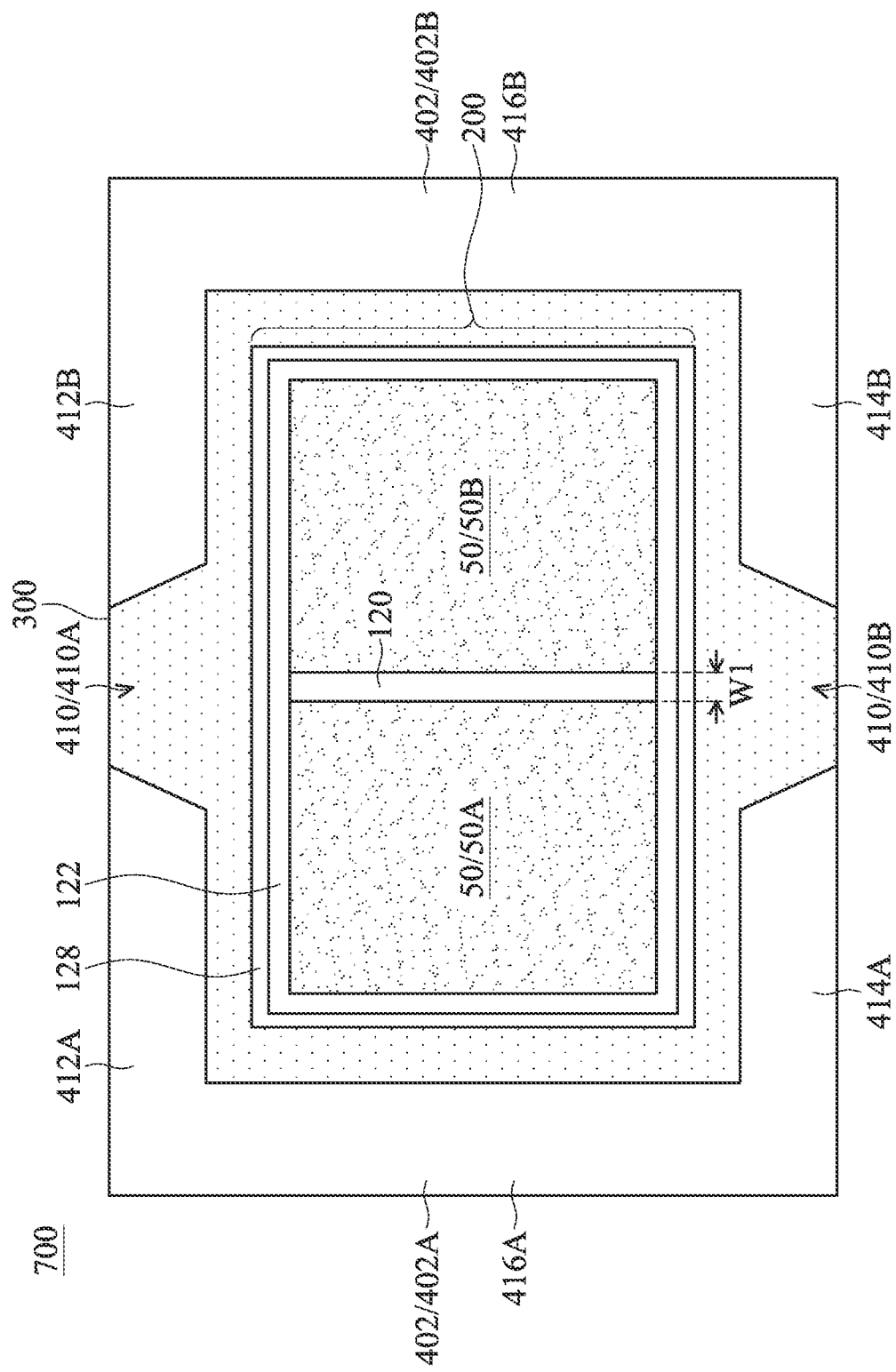
FIG. 14 illustrates a top view of an integrated circuit package, in accordance with some embodiments.

FIG. 14 illustrates a top view of an integrated circuit package 700, in accordance with some embodiments. The integrated circuit package 700 is similar to the integrated circuit package 400 (see FIGS. 10A, 10B and 10C), with similar features being labeled by similar numerical references, and descriptions of the similar features are not repeated herein. In some embodiments, the integrated circuit package 700 may be formed by process steps that are similar to the process steps described above with reference to FIGS. 2-8, 9A-9C and 10A-10C, and the description is not repeated herein. In the illustrated embodiment, the gaps 410 widen as the gaps 410 extend from respective sidewalls of the package substrate 300 toward the package component 200. In some embodiments, a smallest width of the gaps 410 is greater than the width W1 of the die-to-die underfill portion 120.

Figure 15:
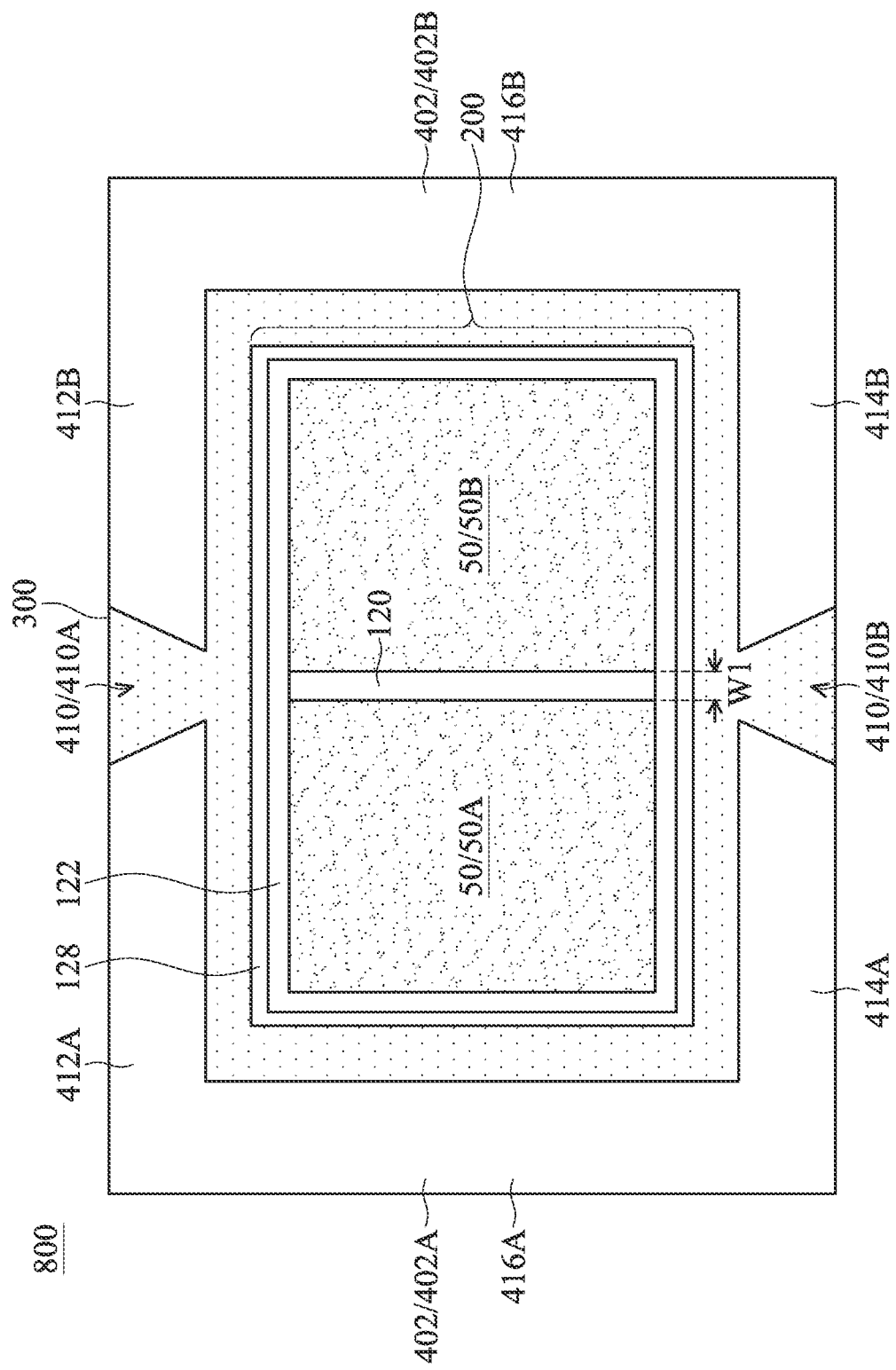
FIG. 15 illustrates a top view of an integrated circuit package, in accordance with some embodiments.

FIG. 15 illustrates a top view of an integrated circuit package 800, in accordance with some embodiments. The integrated circuit package 800 is similar to the integrated circuit package 400 (see FIGS. 10A, 10B and 10C), with similar features being labeled by similar numerical references, and descriptions of the similar features are not repeated herein. In some embodiments, the integrated circuit package 800 may be formed by process steps that are similar to the process steps described above with reference to FIGS. 2-8, 9A-9C and 10A-10C, and the description is not repeated herein. In the illustrated embodiment, the gaps 410 narrow as the gaps 410 extend from respective sidewalls of the package substrate 300 toward the package component 200. In some embodiments, a smallest width of the gaps 410 is greater than the width W1 of the die-to-die underfill portion 120.

Figure 16:
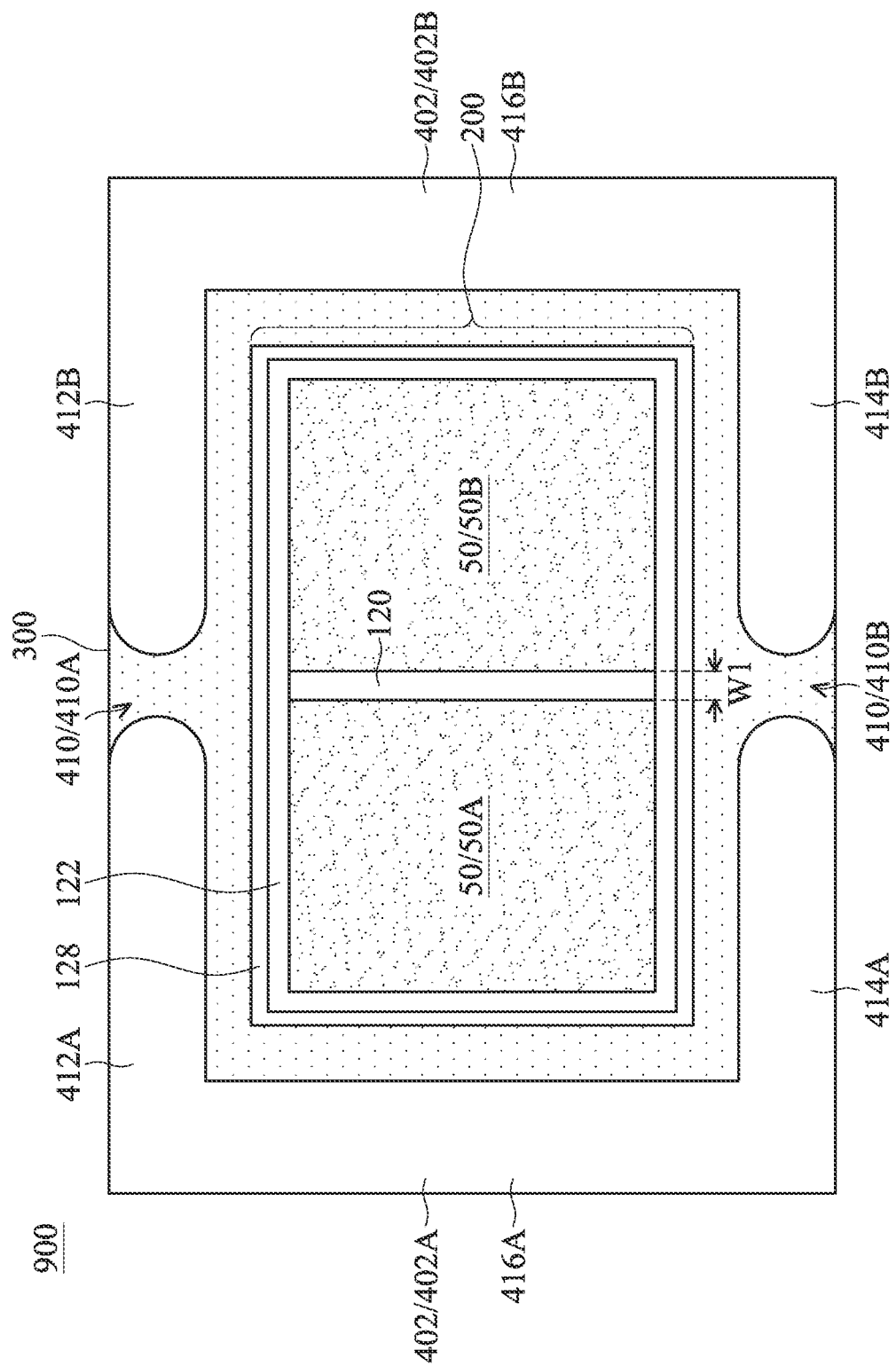
FIG. 16 illustrates a top view of an integrated circuit package, in accordance with some embodiments.

FIG. 16 illustrates a top view of an integrated circuit package 900, in accordance with some embodiments. The integrated circuit package 900 is similar to the integrated circuit package 400 (see FIGS. 10A, 10B and 10C), with similar features being labeled by similar numerical references, and descriptions of the similar features are not repeated herein. In some embodiments, the integrated circuit package 900 may be formed by process steps that are similar to the process steps described above with reference to FIGS. 2-8, 9A-9C and 10A-10C, and the description is not repeated herein. In the illustrated embodiment, the gaps 410 first narrow and then widen as the gaps 410 extend from respective sidewalls of the package substrate 300 toward the package component 200. In some embodiments, a smallest width of the gaps 410 is greater than the width W1 of the die-to-die underfill portion 120. In some embodiments, a sidewall of the first portion 412A of the first disconnected portion 402A of the front-side warpage control structure 402 and a sidewall of the first portion 412B of the second disconnected portion 402B of the front-side warpage control structure 402 that face each other across the first gap 410A are convex sidewalls, and a sidewall of the second portion 414A of the first disconnected portion 402A of the front-side warpage control structure 402 and a sidewall of the second portion 414B of the second disconnected portion 402B of the front-side warpage control structure 402 that face each other across the second gap 410B are convex sidewalls.

Figure 17:
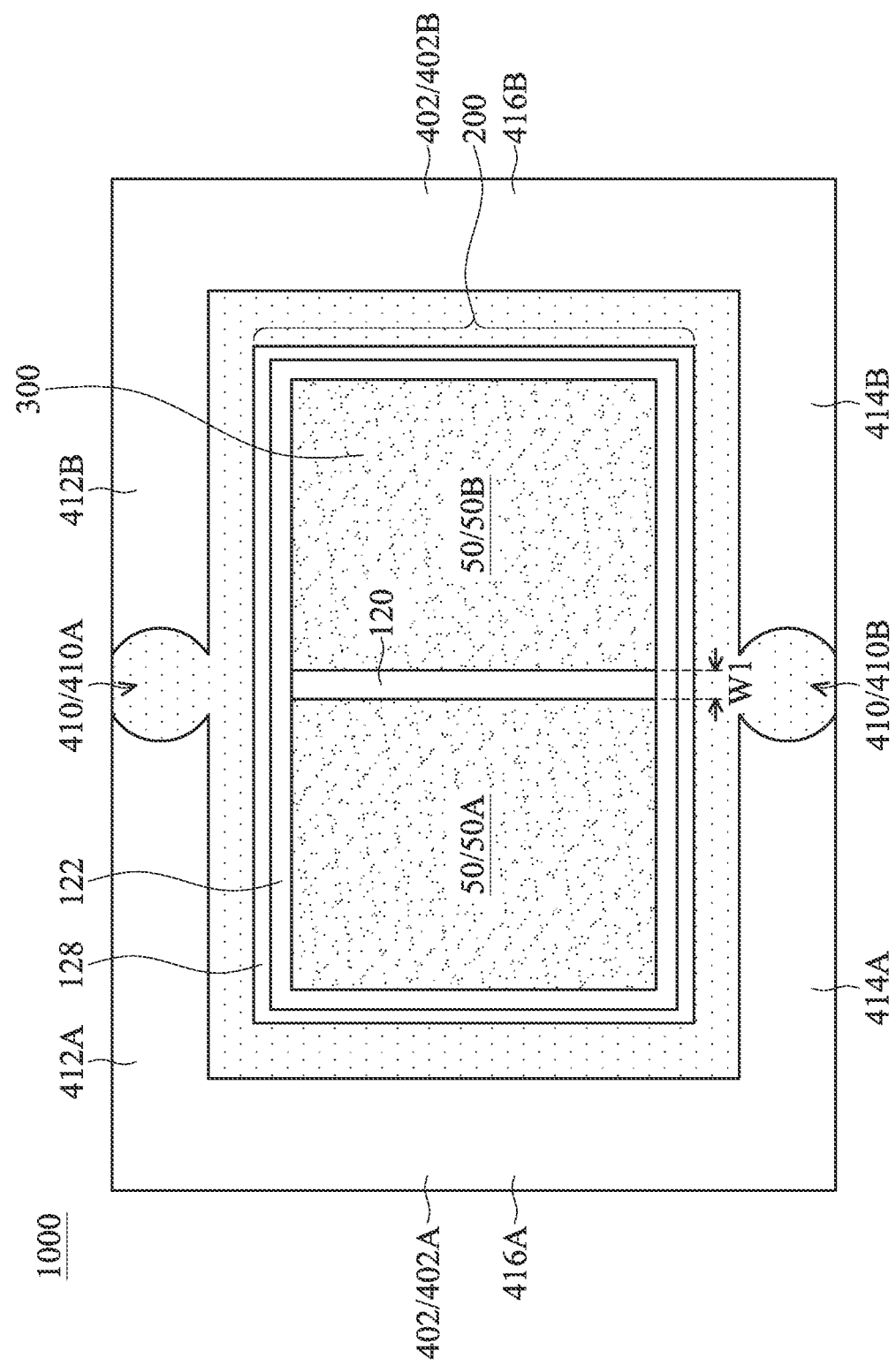
FIG. 17 illustrates a top view of an integrated circuit package, in accordance with some embodiments.

FIG. 17 illustrates a top view of an integrated circuit package 1000, in accordance with some embodiments. The integrated circuit package 900 is similar to the integrated circuit package 400 (see FIGS. 10A, 10B and 10C), with similar features being labeled by similar numerical references, and descriptions of the similar features are not repeated herein. In some embodiments, the integrated circuit package 1000 may be formed by process steps that are similar to the process steps described above with reference to FIGS. 2-8, 9A-9C and 10A-10C, and the description is not repeated herein. In the illustrated embodiment, the gaps 410 first widen and then narrow as the gaps 410 extend from respective sidewalls of the package substrate 300 toward the package component 200. In some embodiments, a smallest width of the gaps 410 is greater than the width W1 of the die-to-die underfill portion 120. In some embodiments, a sidewall of the first portion 412A of the first disconnected portion 402A of the front-side warpage control structure 402 and a sidewall of the first portion 412B of the second disconnected portion 402B of the front-side warpage control structure 402 that face each other across the first gap 410A are concave sidewalls, and a sidewall of the second portion 414A of the first disconnected portion 402A of the front-side warpage control structure 402 and a sidewall of the second portion 414B of the second disconnected portion 402B of the front-side warpage control structure 402 that face each other across the second gap 410B are concave sidewalls.

Figure 18:
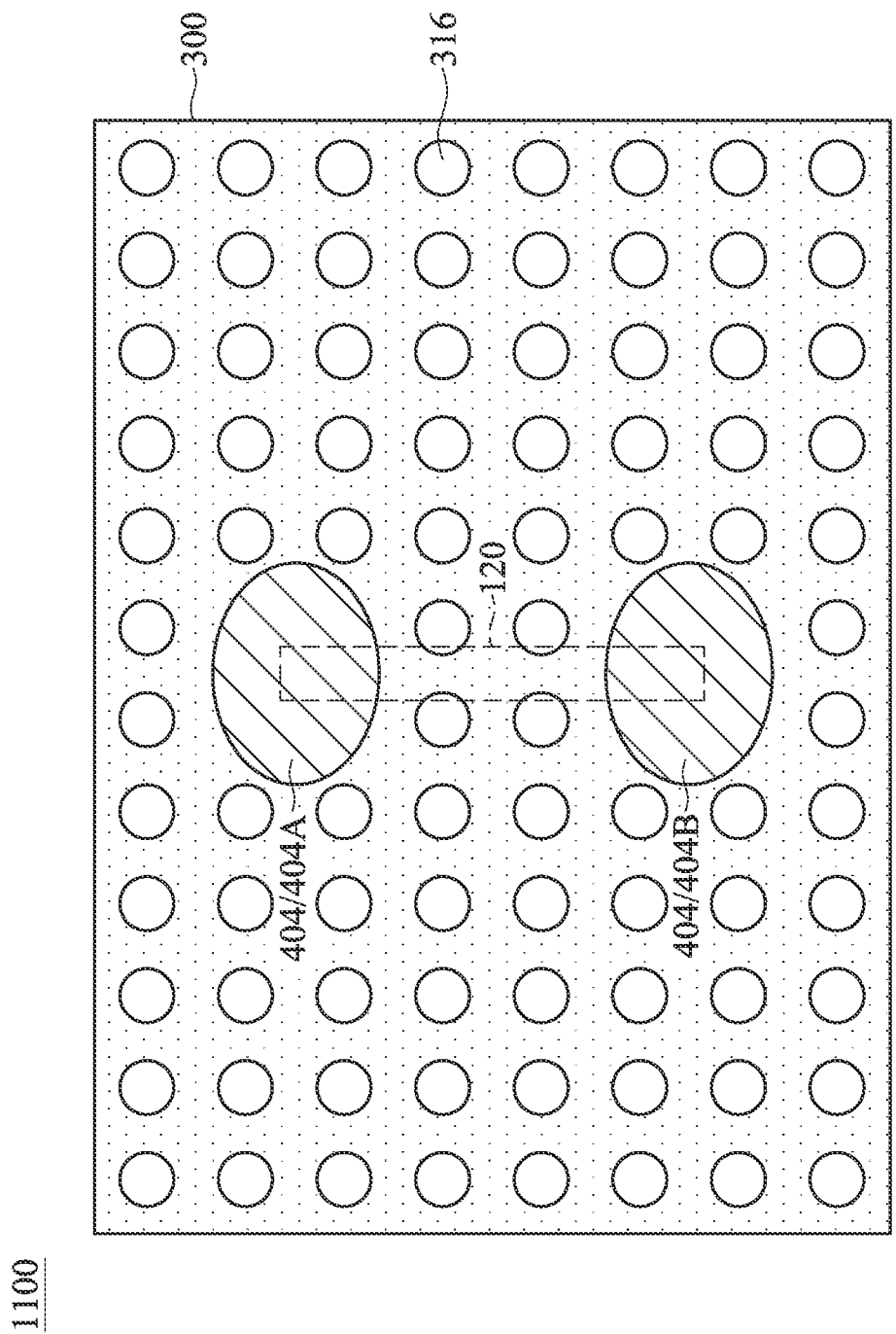
FIG. 18 illustrates a bottom view of an integrated circuit package, in accordance with some embodiments.

FIG. 18 illustrates a bottom view of an integrated circuit package 1100, in accordance with some embodiments. The integrated circuit package 1100 is similar to the integrated circuit package 400 (see FIGS. 10A, 10B and 10C), with similar features being labeled by similar numerical references, and descriptions of the similar features are not repeated herein. In some embodiments, the integrated circuit package 1100 may be formed by process steps that are similar to the process steps described above with reference to FIGS. 2-8, 9A-9C and 10A-10C, and the description is not repeated herein. In the illustrated embodiment, each of the first disconnected portion 404A and the second disconnected portion 404B of the backside warpage control structure 404 has a circular shape in a plan view.

Figure 19:
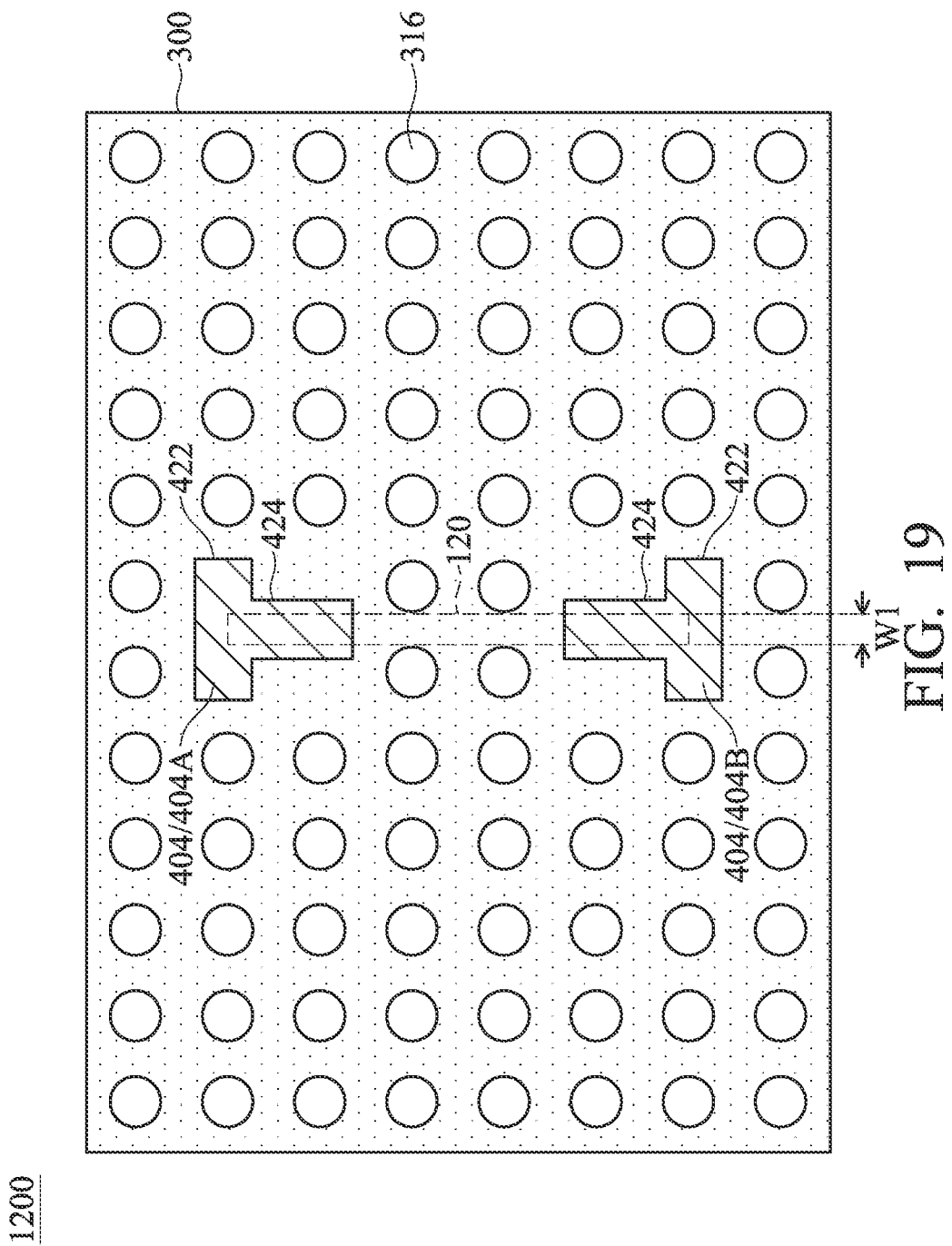
FIG. 19 illustrates a bottom view of an integrated circuit package, in accordance with some embodiments.

FIG. 19 illustrates a bottom view of an integrated circuit package 1200, in accordance with some embodiments. The integrated circuit package 1200 is similar to the integrated circuit package 400 (see FIGS. 10A, 10B and 10C), with similar features being labeled by similar numerical references, and descriptions of the similar features are not repeated herein. In some embodiments, the integrated circuit package 1200 may be formed by process steps that are similar to the process steps described above with reference to FIGS. 2-8, 9A-9C and 10A-10C, and the description is not repeated herein. In the illustrated embodiment, each of the first disconnected portion 404A and the second disconnected portion 404B of the backside warpage control structure 404 has a T-like shape in a plan view, such that each of the first disconnected portion 404A and the second disconnected portion 404B of the backside warpage control structure 404 comprises a wide portion 422, and a narrow portion 424 connected to the wide portion 422. In some embodiments, the narrow portion 424 of the first disconnected portion 404A of the backside warpage control structure 404 faces the narrow portion 424 of the second disconnected portion 404B of the backside warpage control structure 404. In some embodiments, a width of the narrow portion 424 of the first disconnected portion 404A of the backside warpage control structure 404 and a width of the narrow portion 424 of the second disconnected portion 404B of the backside warpage control structure 404 are greater than the width W1 of the die-to-die underfill portion 120.

Figure 20:
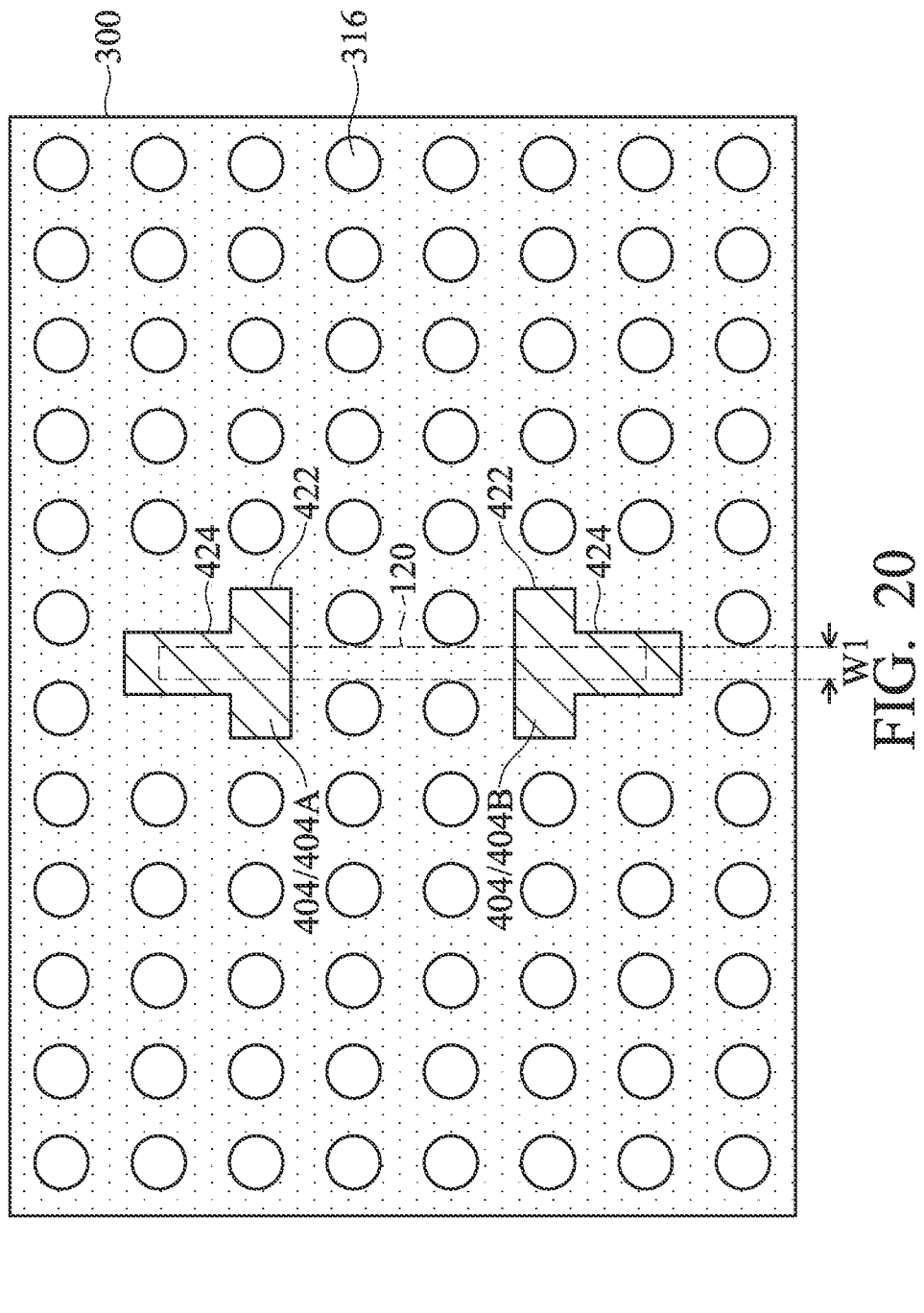
FIG. 20 illustrates a bottom view of an integrated circuit package, in accordance with some embodiments.

FIG. 20 illustrates a bottom view of an integrated circuit package 1300, in accordance with some embodiments. The integrated circuit package 1300 is similar to the integrated circuit package 400 (see FIGS. 10A, 10B and 10C), with similar features being labeled by similar numerical references, and descriptions of the similar features are not repeated herein. In some embodiments, the integrated circuit package 1300 may be formed by process steps that are similar to the process steps described above with reference to FIGS. 2-8, 9A-9C and 10A-10C, and the description is not repeated herein. In the illustrated embodiment, each of the first disconnected portion 404A and the second disconnected portion 404B of the backside warpage control structure 404 has a T-like shape in a plan view, such that each of the first disconnected portion 404A and the second disconnected portion 404B of the backside warpage control structure 404 comprises a wide portion 422, and a narrow portion 424 connected to the wide portion 422. In some embodiments, the wide portion 422 of the first disconnected portion 404A of the backside warpage control structure 404 faces the wide portion 422 of the second disconnected portion 404B of the backside warpage control structure 404. In some embodiments, a width of the narrow portion 424 of the first disconnected portion 404A of the backside warpage control structure 404 and a width of the narrow portion 424 of the second disconnected portion 404B of the backside warpage control structure 404 are greater than the width W1 of the die-to-die underfill portion 120.

Figure 21B:
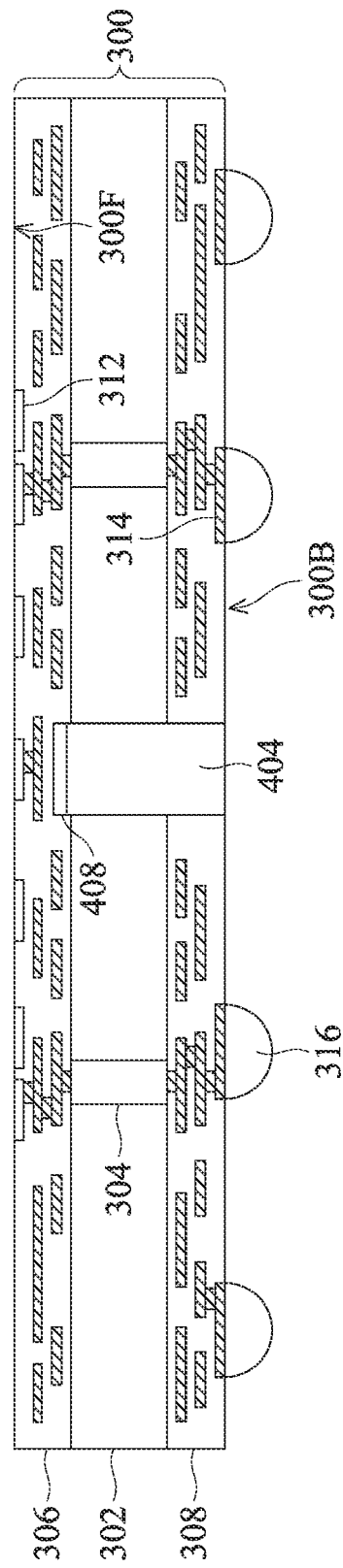
Figure 22A:
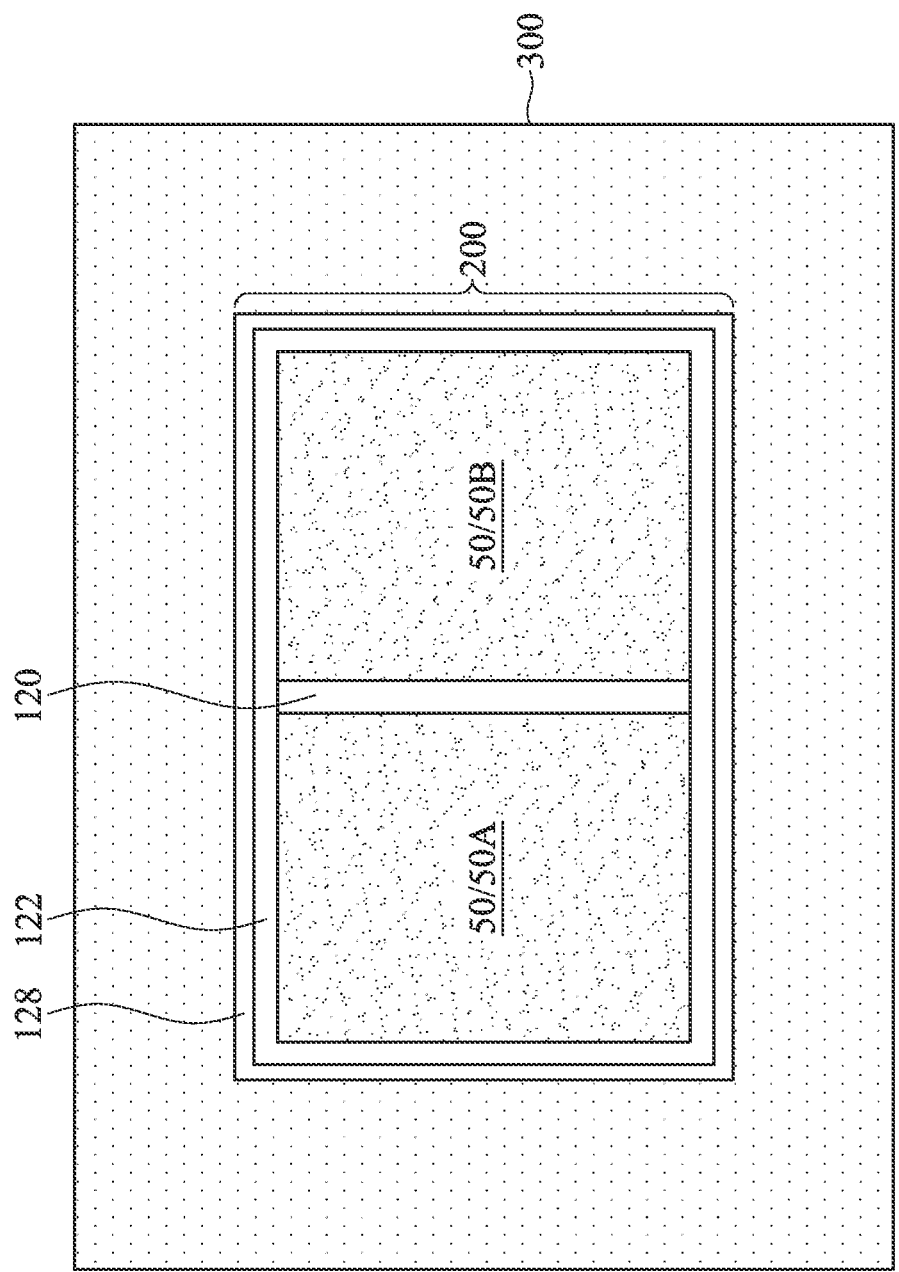
Figure 22B:
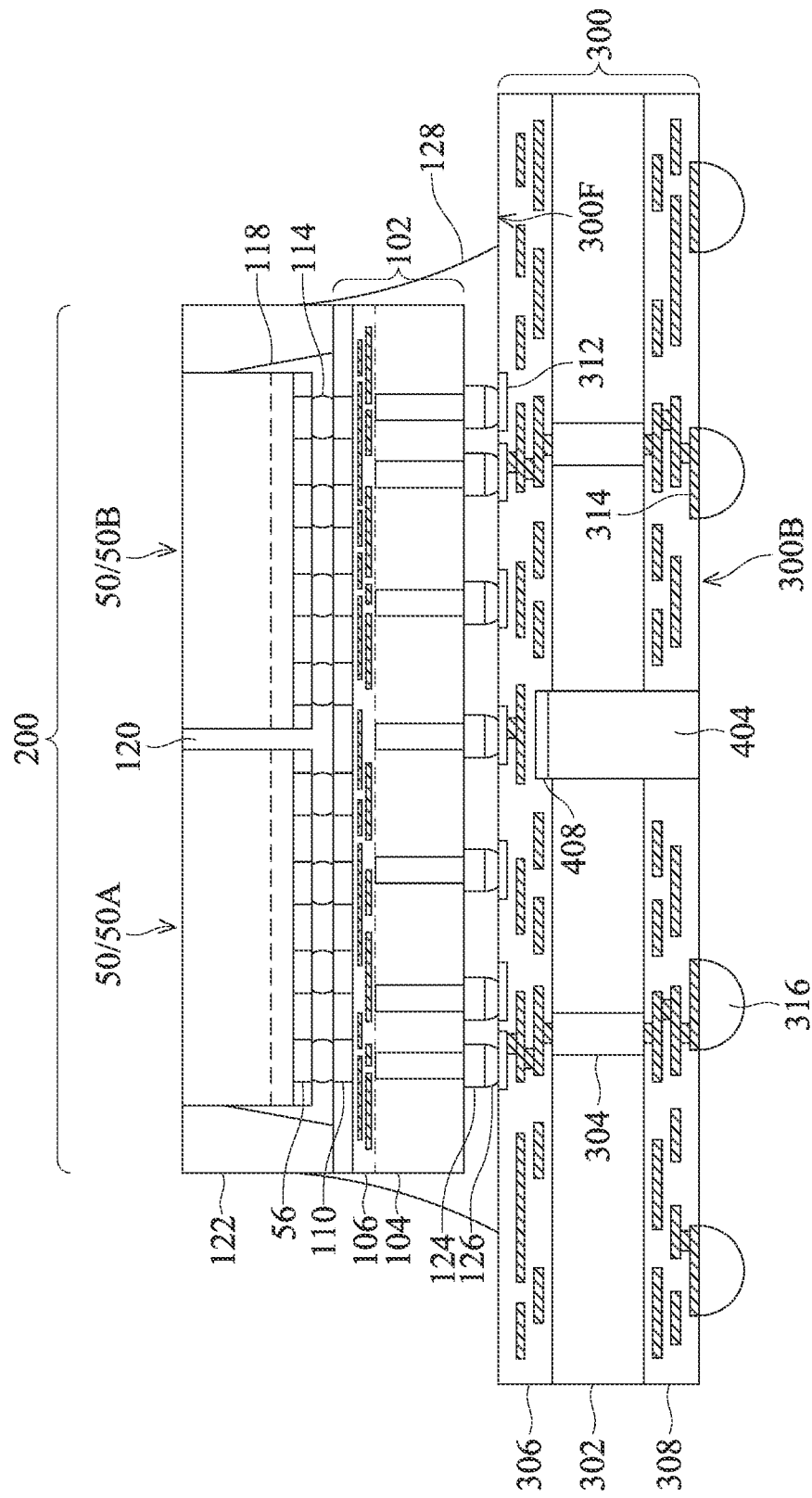
Figure 23B:
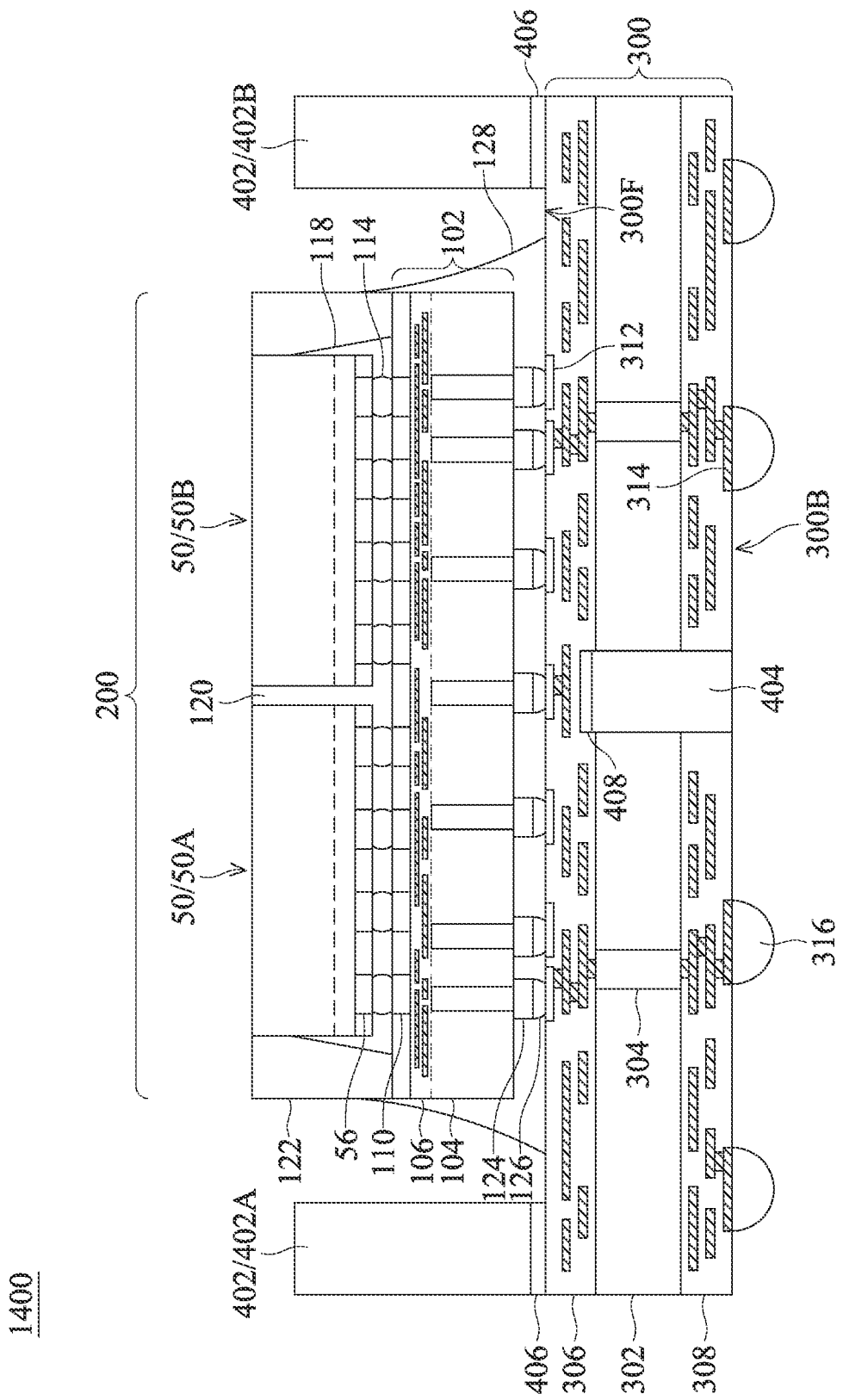

FIGS. 21A, 21B, 22A, 22B, 23A, and 23B illustrate top, bottom and cross-sectional views of intermediate stages in the manufacturing of integrated circuit packages 1400 using the package components 200 (see FIG. 8), in accordance with some embodiments. In particular, FIGS. 22A and 23A illustrate top views, FIG. 21A illustrates a bottom view, and FIGS. 21B, 22B, and 23B illustrate cross-sectional views. The integrated circuit packages 1400 may be chip-on-wafer-on-substrate (CoWoS) devices.

In FIGS. 21A and 21B, a package substrate 300 is provided or formed. In some embodiments, the package substrate 300 may be formed as described above with reference to FIGS. 9A-9C, and the description is not repeated herein. A backside warpage control structure 404 (comprising disconnected portions, such as a first disconnected portion 404A and a second disconnected portion 404B) is embedded into the package substrate 300 from a backside 300B of the package substrate 300 and is attached to the package substrate 300 by an adhesive 408 as described above with reference to FIGS. 10B and 10C, and the description is not repeated herein.

In FIGS. 22A and 22B, after embedding the backside warpage control structure 404 into the package substrate 300, a package component 200 is mounted on a front side 300F of the package substrate 300 as described above with reference to FIGS. 9A and 9C, and the description is not repeated herein. Subsequently, an underfill 128 is formed between the package component 200 and the package substrate 300, surrounding the conductive connectors 126 as described above with reference to FIG. 9C, and the description is not repeated herein.

In FIGS. 23A and 23B, after mounting the package component 200 on the package substrate 300, a front-side warpage control structure 402 (comprising disconnect portions, such as a first disconnected portion 402A and a second disconnected portion 402B separated by gaps 410) is attached to the front side 300F of the package substrate 300 by an adhesive 406 as described above with reference to FIGS. 10A and 10C, and the description is not repeated herein.

Figure 24B:
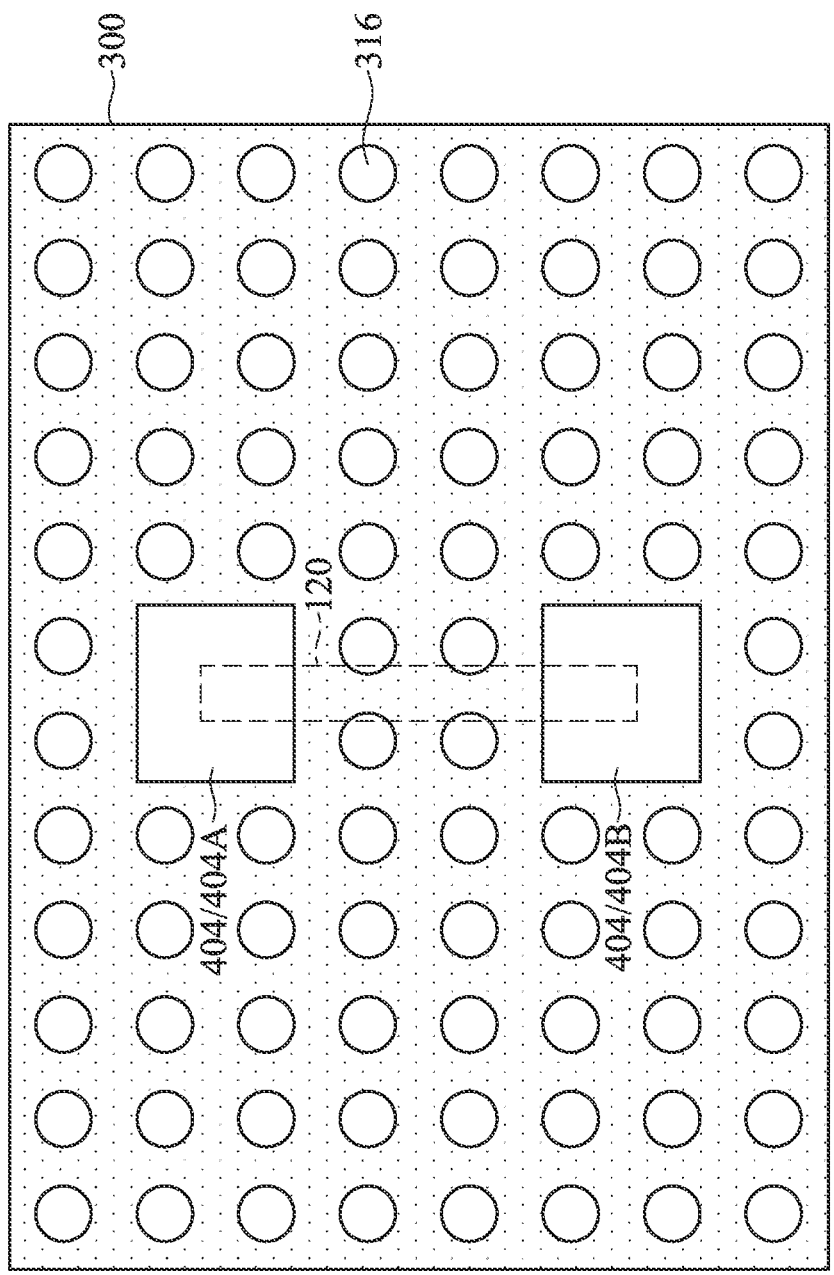
Figure 24C:
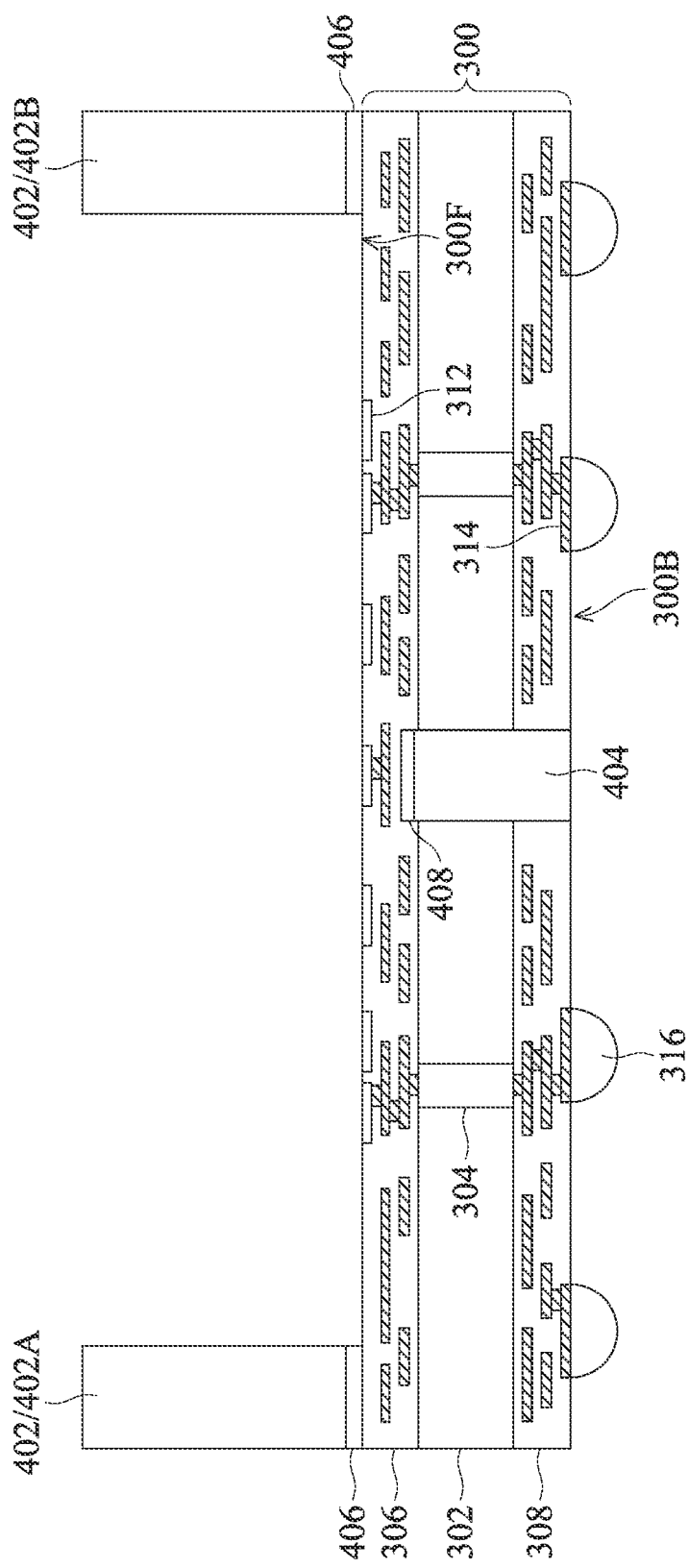
Figure 25A:
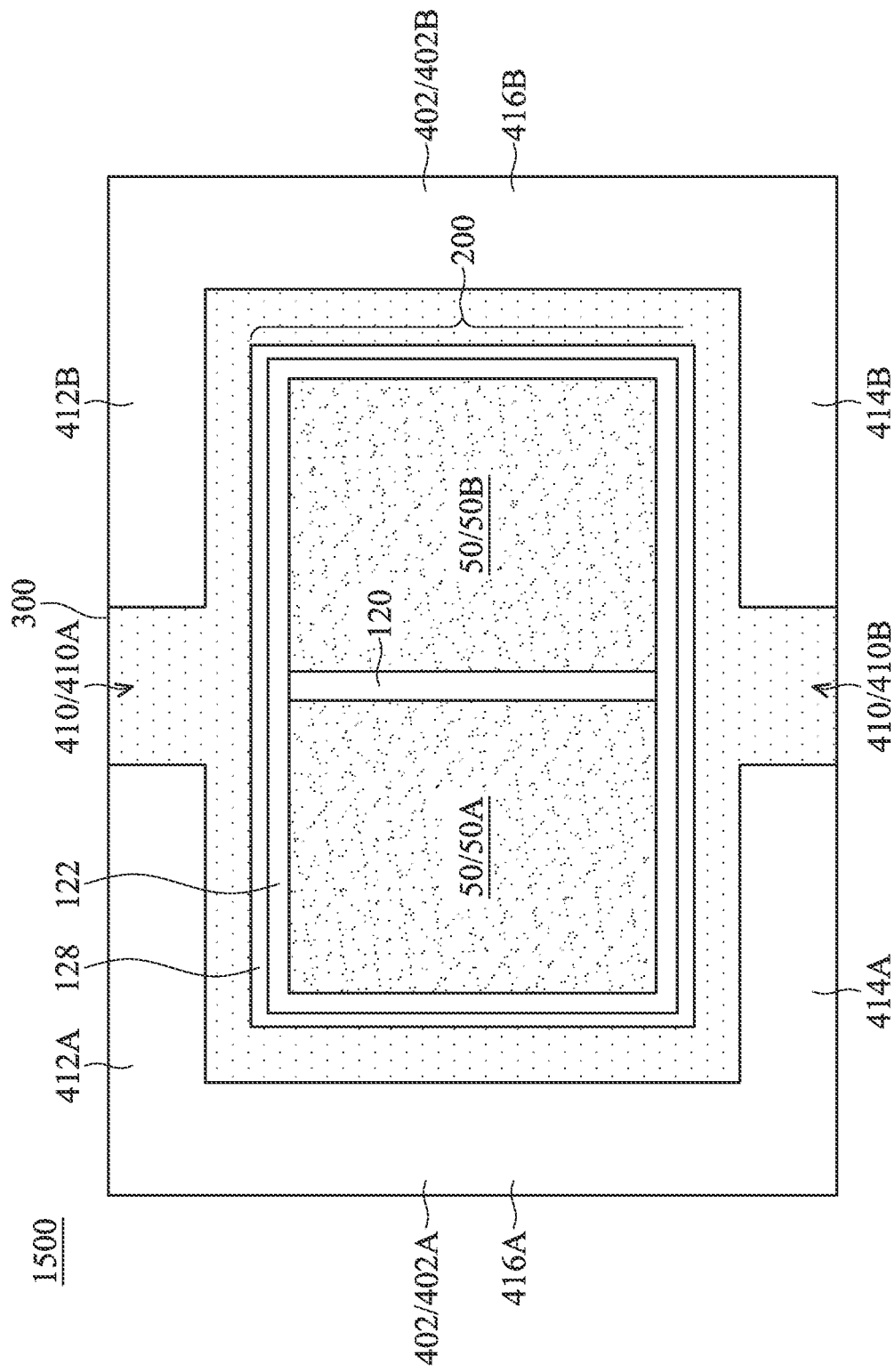
Figure 25B:
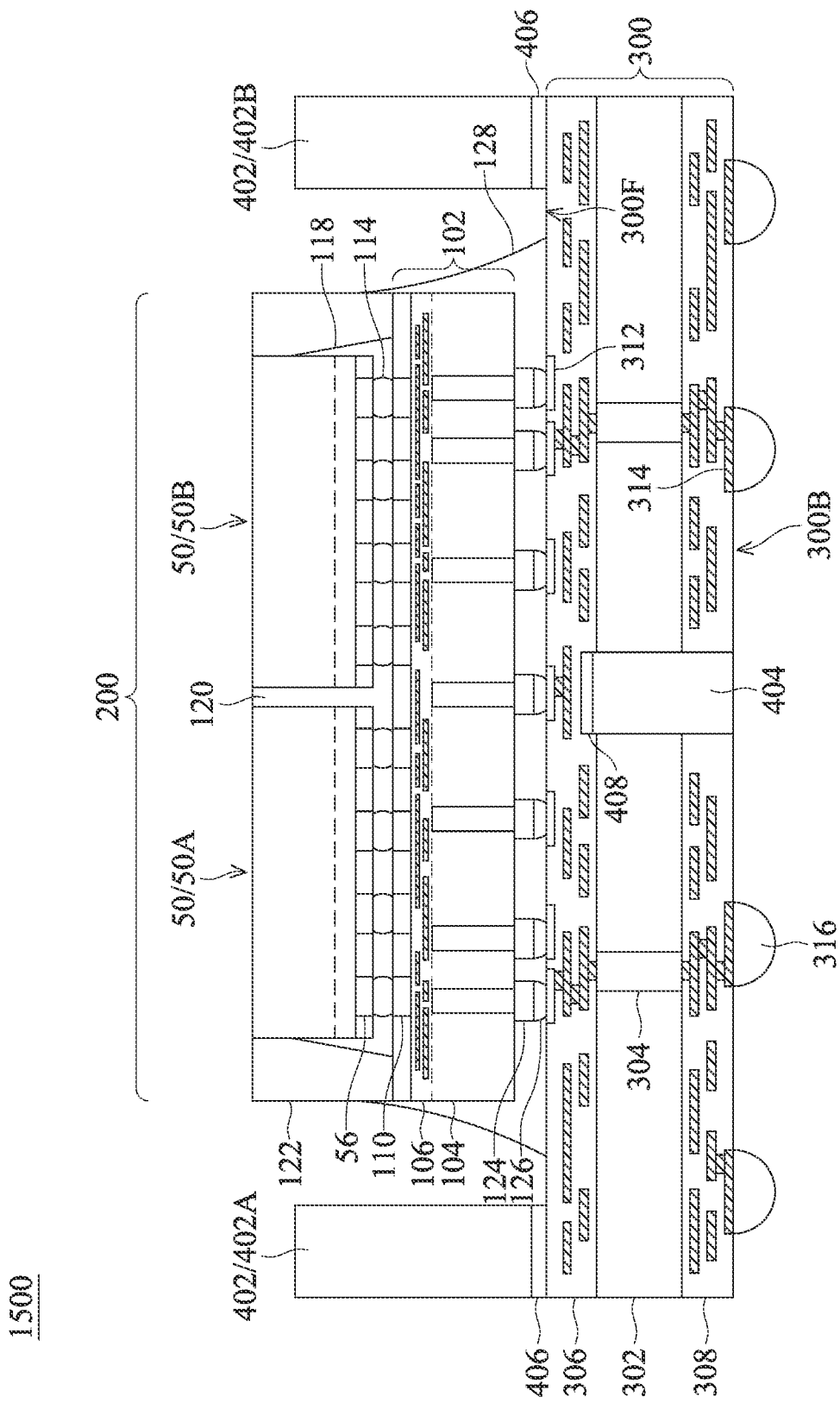

FIGS. 24A-24C, 25A, and 25B illustrate top, bottom and cross-sectional views of intermediate stages in the manufacturing of integrated circuit packages 1500 using the package components 200 (see FIG. 8), in accordance with some embodiments. In particular, FIGS. 24A and 25A illustrate top views, FIG. 24B illustrates a bottom view, and FIGS. 24C and 25B illustrate cross-sectional views. The integrated circuit packages 1500 may be chip-on-wafer-on-substrate (CoWoS) devices.

In FIGS. 24A, 24B, and 24C, a package substrate 300 is provided or formed. In some embodiments, the package substrate 300 may be formed as described above with reference to FIGS. 9A-9C, and the description is not repeated herein. A front-side warpage control structure 402 (comprising disconnect portions, such as a first disconnected portion 402A and a second disconnected portion 402B separated by gaps 410) is attached to a front side 300F of the package substrate 300 by an adhesive 406 as described above with reference to FIGS. 10A and 10C, and the description is not repeated herein.

Subsequently, a backside warpage control structure 404 (comprising disconnected portions, such as a first disconnected portion 404A and a second disconnected portion 404B) is embedded into the package substrate 300 from a backside 300B of the package substrate 300 and is attached to the package substrate 300 by an adhesive 408 as described above with reference to FIGS. 10B and 10C, and the description is not repeated herein.

In FIGS. 25A and 25B, after attaching the front-side warpage control structure 402 and the backside warpage control structure 404 to the package substrate 300, a package component 200 is mounted on the front side 300F of the package substrate 300 as described above with reference to FIGS. 9A and 9C, and the description is not repeated herein. Subsequently, an underfill 128 is formed between the package component 200 and the package substrate 300, surrounding the conductive connectors 126 as described above with reference to FIG. 9C, and the description is not repeated herein.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. Forming the gaps 410 separating the first disconnected portion 402A and the second disconnected portion 402B of the front-side warpage control system 402 as described above with reference to FIGS. 10A and 10C advantageously allows for stress relieving in the die-to-die underfill portion 120, and reducing or avoiding delamination of or crack formation in the die-to-die underfill portion 120. Forming the first disconnected portion 404A and the second disconnected portion 404B of the backside warpage control structure 404 as described above with reference to FIGS. 10B and 10C, such that the first disconnected portion 404A and the second disconnected portion 404B of the backside warpage control structure 404 overlap with respective opposing ends of the die-to-die underfill portion 120 in a plan view, advantageously allows for reducing a package warpage caused by the gaps 410 separating the first disconnected portion 402A and the second disconnected portion 402B of the front-side warpage control structure 402.

In accordance with an embodiment, a package includes a package substrate, the package substrate having a first side and a second side opposite to the first side, a package component bonded to the first side of the package substrate, a front-side warpage control structure attached to the first side of the package substrate, and a backside warpage control structure embedded in the package substrate from the second side of the package substrate. The package component includes a first integrated circuit die, a second integrated circuit die, and a die-to-die underfill region between the first integrated circuit die and the second integrated circuit die. The front-side warpage control structure includes a first disconnected structure and a second disconnected structure laterally separated from each other by a first gap. The first gap is disposed near a first end of the die-to-die underfill region. The backside warpage control structure includes a third disconnected structure and a fourth disconnected structure laterally separated from each other. The third disconnected structure overlaps with the first end of the die-to-die underfill region in a plan view. The fourth disconnected structure overlaps with a second end of the die-to-die underfill region in the plan view. In an embodiment, the first disconnected structure and the second disconnected structure are further laterally separated from each other by a second gap, the second gap being disposed at the second end of the die-to-die underfill region, the package component being interposed between the first gap and the second gap. In an embodiment, the first disconnected structure of the front-side warpage control structure extends along sidewalls of the package component. In an embodiment, a sidewall of the first disconnected structure of the front-side warpage control structure is coplanar with a sidewall of the package substrate. In an embodiment, a sidewall of the first disconnected structure of the front-side warpage control structure and a sidewall of the second disconnected structure of the front-side warpage control structure facing each other across the first gap are convex sidewalls. In an embodiment, a sidewall of the first disconnected structure of the front-side warpage control structure and a sidewall of the second disconnected structure of the front-side warpage control structure facing each other across the first gap are concave sidewalls. In an embodiment, a width of the first gap is greater than a width of the die-to-die underfill region in the plan view.

In accordance with another embodiment, a package includes a package substrate, the package substrate having a first side and a second side opposite to the first side, a package component bonded to the first side of the package substrate, a front-side warpage control structure attached to the first side of the package substrate using a first adhesive, and a backside warpage control structure attached to the package substrate using a second adhesive. The package component includes an interposer, a first integrated circuit die and a second integrated circuit die bonded to the interposer, and a die-to-die underfill region between the first integrated circuit die and the second integrated circuit die. The front-side warpage control structure includes a first disconnected structure and a second disconnected structure laterally separated from each other by a first gap and a second gap. The package component is interposed between the first gap and the second gap. The first gap is disposed at a first end of the die-to-die underfill region. The second gap is disposed at a second end of the die-to-die underfill region. The backside warpage control structure is embedded in the package substrate from the second side of the package substrate. The backside warpage control structure includes a third disconnected structure and a fourth disconnected structure laterally separated from each other. The first end of the die-to-die underfill region is disposed within a perimeter of the third disconnected structure in a plan view. The second end of the die-to-die underfill region is disposed within a perimeter of the fourth disconnected structure in the plan view. In an embodiment, a width of the first gap increases as the first gap extends from a sidewall of the package substrate toward the package component. In an embodiment, a width of the first gap decreases as the first gap extends from a sidewall of the package substrate toward the package component. In an embodiment, a width of the first gap remains constant as the first gap extends from a sidewall of the package substrate toward the package component. In an embodiment, each of the third disconnected structure and the fourth disconnected structure has a rectangular shape, a circular shape, or a T-like shape in the plan view. In an embodiment, a width of the third disconnected structure and a width of the fourth disconnected structure are greater than a width of the die-to-die underfill region. In an embodiment, a height of the package substrate is greater than a height of the backside warpage control structure.

In accordance with yet another embodiment, a method includes forming a package component. The package component includes an interposer, a first integrated circuit die and a second integrated circuit die bonded to the interposer, and a die-to-die underfill region between the first integrated circuit die and the second integrated circuit die. The package component is bonded to a first side of a package substrate. A front-side warpage control structure is attached to the first side of the package substrate adjacent the package component. The front-side warpage control structure includes a first disconnected structure and a second disconnected structure laterally separated from each other by a first gap. The first gap is disposed at a first end of the die-to-die underfill region. A backside warpage control structure is attached to the package substrate. The backside warpage control structure is embedded in the package substrate from a second side of the package substrate. The backside warpage control structure overlaps with the die-to-die underfill region in a plan view. In an embodiment, the method further includes forming a second underfill between the package substrate and the package component, where the second underfill is in physical contact with a sidewall of the interposer. In an embodiment, a height of the front-side warpage control structure is greater than a height of the package component. In an embodiment, the front-side warpage control structure is attached to the first side of the package substrate using a first adhesive. In an embodiment, the backside warpage control structure is attached to the package substrate using a second adhesive. In an embodiment, the method further includes, before attaching the backside warpage control structure to the package substrate, forming an opening in the package substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a package substrate, the package substrate having a first side and a second side opposite to the first side;
   a package component bonded to the first side of the package substrate, the package component comprising an interposer, a first integrated circuit die attached to a first side of the interposer, a second integrated circuit die attached to a first side of the interposer, and a die-to-die underfill region between the first integrated circuit die and the second integrated circuit die, wherein the die-to-die underfill region is free of another integrated circuit die;

a front-side warpage control structure attached to the first side of the package substrate, the front-side warpage control structure comprising a first disconnected structure and a second disconnected structure laterally separated from each other by a first gap, a first line parallel to a longitudinal axis of the die-to-die underfill region intersecting the first disconnected structure and the first integrated circuit die, a second line parallel to the longitudinal axis of the die-to-die underfill region intersecting the second disconnected structure and the second integrated circuit die, the longitudinal axis of the die-to-die underfill region extending through the first gap; and a backside warpage control structure embedded in the package substrate from the second side of the package substrate, the backside warpage control structure comprising a third disconnected structure and a fourth disconnected structure laterally separated from each other, the third disconnected structure overlapping with a first end of the die-to-die underfill region in a plan view, the fourth disconnected structure overlapping with a second end of the die-to-die underfill region in the plan view.

2. The package of claim 1, wherein the first disconnected structure and the second disconnected structure are further laterally separated from each other by a second gap, the second gap being disposed at the second end of the die-to-die underfill region, the package component being interposed between the first gap and the second gap.

3. The package of claim 1, wherein the first disconnected structure of the front-side warpage control structure extends along sidewalls of the package component.

4. The package of claim 1, wherein a sidewall of the first disconnected structure of the front-side warpage control structure is coplanar with a sidewall of the package substrate.

5. The package of claim 1, wherein a sidewall of the first disconnected structure of the front-side warpage control structure and a sidewall of the second disconnected structure of the front-side warpage control structure facing each other across the first gap are convex sidewalls.

6. The package of claim 1, wherein a sidewall of the first disconnected structure of the front-side warpage control structure and a sidewall of the second disconnected structure of the front-side warpage control structure facing each other across the first gap are concave sidewalls.

7. The package of claim 1, wherein a width of the first gap is greater than a width of the die-to-die underfill region in the plan view.

8. A package comprising:
a package substrate, the package substrate having a first side and a second side opposite to the first side;
a package component bonded to the first side of the package substrate, the package component comprising:
an interposer bonded to the first side of the package substrate;
a first integrated circuit die and a second integrated circuit die bonded to the interposer; and
a die-to-die underfill region between the first integrated circuit die and the second integrated circuit die;
a front-side warpage control structure attached to the first side of the package substrate using a first adhesive, the front-side warpage control structure comprising a first disconnected structure and a second disconnected structure laterally separated from each other by a first gap and a second gap, the package component being interposed between the first gap and the second gap, the first gap being aligned with a first end of the die-to-die underfill region, the second gap being aligned with a second end of the die-to-die underfill region; and a backside warpage control structure attached to the package substrate using a second adhesive, the backside warpage control structure being embedded in the package substrate from the second side of the package substrate, the backside warpage control structure comprising a third disconnected structure and a fourth disconnected structure laterally separated from each other, the first end of the die-to-die underfill region being disposed within a perimeter of the third disconnected structure in a plan view, the second end of the die-to-die underfill region being disposed within a perimeter of the fourth disconnected structure in the plan view.

9. The package of claim 8, wherein a width of the first gap increases as the first gap extends in a direction away from a sidewall of the package substrate toward the package component.

10. The package of claim 8, wherein a width of the first gap decreases as the first gap extends in a direction away from a sidewall of the package substrate toward the package component.

11. The package of claim 8, wherein a width of the first gap remains constant as the first gap extends from a sidewall of the package substrate toward the package component.

12. The package of claim 8, wherein each of the third disconnected structure and the fourth disconnected structure has a rectangular shape, a circular shape, or a T-like shape in the plan view.

13. The package of claim 8, wherein a width of the third disconnected structure and a width of the fourth disconnected structure are greater than a width of the die-to-die underfill region.

14. The package of claim 8, wherein a height of the package substrate is greater than a height of the backside warpage control structure.

15. A package comprising:
a package substrate, the package substrate having a first side and a second side opposite to the first side;
a package component bonded to the first side of the package substrate, the package component comprising an interposer, a first integrated circuit die attached to the interposer, a second integrated circuit die attached to the interposer, and a die-to-die underfill region between the first integrated circuit die and the second integrated circuit die, wherein the interposer is attached to the first side of the package substrate; and
a backside warpage control structure attached to the second side of the package substrate, the backside warpage control structure comprising a first disconnected structure, the first disconnected structure overlapping the die-to-die underfill region in a plan view.

16. The package of claim 15, wherein the package substrate comprises:
a core substrate;
a first interconnect structure on a first side of the core substrate, wherein the first interconnect structure is between the core substrate and the package component; and a second interconnect structure on a second side of the core substrate, wherein the backside warpage control structure extends through the second interconnect structure.

17. The package of claim 16, wherein the backside warpage control structure extends into the core substrate.

18. The package of claim 15, wherein the backside warpage control structure further comprises:
a second disconnected structure laterally separated from the first disconnected structure, wherein the second disconnected structure overlaps the die-to-die underfill region in the plan view.

19. The package of claim 18, wherein the first disconnected structure overlaps a first corner of the first integrated circuit die and a first corner of the second integrated circuit die in the plan view, wherein the second disconnected structure overlaps a second corner of the first integrated circuit die and a second corner of the second integrated circuit die in the plan view.

20. The package of claim 15, further comprising:
a front-side warpage control structure attached to the first side of the package substrate, the front-side warpage control structure comprising a second disconnected structure and a third disconnected structure laterally separated from each other by a first gap, wherein the first gap is aligned with the die-to-die underfill region.

* * * * *